United States Patent
Ji et al.

(10) Patent No.: US 7,357,138 B2
(45) Date of Patent: Apr. 15, 2008

(54) METHOD FOR ETCHING HIGH DIELECTRIC CONSTANT MATERIALS AND FOR CLEANING DEPOSITION CHAMBERS FOR HIGH DIELECTRIC CONSTANT MATERIALS

(75) Inventors: Bing Ji, Allentown, PA (US); Stephen Andrew Motika, Kutztown, PA (US); Ronald Martin Pearlstein, Macungie, PA (US); Eugene Joseph Karwacki, Jr., Orefield, PA (US); Dingjun Wu, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 284 days.

(21) Appl. No.: 10/723,714

(22) Filed: Nov. 26, 2003

(65) Prior Publication Data
US 2004/0129671 A1    Jul. 8, 2004

Related U.S. Application Data

(63) Continuation-in-part of application No. 10/410,803, filed on Apr. 10, 2003, which is a continuation-in-part of application No. 10/198,509, filed on Jul. 18, 2002, now abandoned.

(51) Int. Cl.
*B08B 9/00* (2006.01)
*B08B 6/00* (2006.01)
(52) U.S. Cl. .................. 134/22.1; 134/1.1; 216/67; 216/76
(58) Field of Classification Search .......... 134/1.1, 134/1.2, 22.1; 216/67, 76; 438/714, 720; 156/345.29, 345.33, 345.43; 252/79.1, 79.2, 252/79.3
See application file for complete search history.

(56) References Cited

U.S. PATENT DOCUMENTS 4,030,967 A  *  6/1977  Ingrey et al. ............... 216/67
5,288,662 A       2/1994  Lagendijk et al.

(Continued)

FOREIGN PATENT DOCUMENTS

EP            1 001 459 A2    5/2000

(Continued)

OTHER PUBLICATIONS

K. K. Shih, "Hafnium Dioxide Etch-Stop Layer for Phase-Shifting Masks," J. Vac. Sci. Technol. B 11(6), pp. 2130-2131 (1993).

(Continued)

*Primary Examiner*—George A. Goudreau
(74) *Attorney, Agent, or Firm*—Rosaleen P. Morris-Oskanian

(57) ABSTRACT

A process for the removal of a substance from a substrate for etching and/or cleaning applications is disclosed herein. In one embodiment, there is provided a process for removing a substance having a dielectric constant greater than silicon dioxide from a substrate by reacting the substance with a reactive agent that comprises at least one member from the group consisting a halogen-containing compound, a boron-containing compound, a hydrogen-containing compound, nitrogen-containing compound, a chelating compound, a carbon-containing compound, a chlorosilane, a hydrochlorosilane, or an organochlorosilane to form a volatile product and removing the volatile product from the substrate to thereby remove the substance from the substrate.

14 Claims, 9 Drawing Sheets

U.S. PATENT DOCUMENTS

| | | | |
|---|---|---|---|
| 5,298,075 | A | 3/1994 | Lagendijk et al. |
| 5,356,478 | A | 10/1994 | Chen et al. |
| 5,454,903 | A | 10/1995 | Redeker et al. |
| 5,637,153 | A | 6/1997 | Niino et al. |
| 5,756,400 | A | 5/1998 | Ye et al. |
| 5,879,459 | A | 3/1999 | Gadgil et al. |
| 5,972,722 | A | 10/1999 | Visokay et al. |
| 6,174,377 | B1 | 1/2001 | Doering et al. |
| 6,211,035 | B1 | 4/2001 | Moise et al. |
| 6,238,582 | B1 | 5/2001 | Williams et al. |
| 6,387,185 | B2 | 5/2002 | Doering et al. |
| 6,495,054 | B1 | 12/2002 | Eguchi et al. |
| 6,613,695 | B2 * | 9/2003 | Pomarede et al. .......... 438/767 |
| 2001/0023744 | A1 | 9/2001 | Komino |
| 2003/0170986 | A1 * | 9/2003 | Nallan et al. ............... 438/689 |
| 2004/0011380 | A1 * | 1/2004 | Ji et al. ....................... 134/1.1 |
| 2004/0121620 | A1 * | 6/2004 | Pomarede et al. .......... 438/785 |
| 2005/0020071 | A1 * | 1/2005 | Sonobe et al. ............. 438/689 |
| 2005/0074983 | A1 | 4/2005 | Shinriki et al. |

FOREIGN PATENT DOCUMENTS

| | | |
|---|---|---|
| EP | 1 382 716 A | 1/2004 |
| EP | 1 460 678 A | 9/2004 |
| JP | 2003 203907 | 7/2003 |
| JP | 2003-203907 * | 7/2003 |
| JP | 2004039788 | 5/2004 |
| KR | 2000046489 * | 7/2000 |
| WO | WO 98/27005 A | 6/1998 |
| WO | WO 00/40772 | 7/2000 |
| WO | WO 00/79019 A1 | 12/2000 |
| WO | WO 02/43114 A2 | 5/2002 |
| WO | WO 02/43115 | 5/2002 |
| WO | WO 02/43115 A2 | 5/2002 |
| WO | WO 03/012843 | 2/2003 |

OTHER PUBLICATIONS

J. A. Britten, "Etch-Stop Characteristics of $Sc_2O_3$ and $HfO_2$ Films for . . . ," J. Vac Sci. Technol. A 14(5), pp. 2973-2975 (1996).

J. Hong, "Comparison of $Cl_2$ and $F_2$ Based Chemistries for the . . . ," J. Vac. Sci. Technol. A 17(4), pp. 1326-1330 (1999).

J. W. Lee, "Electron Cyclotron Resonance Plasma Etching of Oxides . . . ," J. Vac Sci. Technol. A 16(3), pp. 1944-1948.

W. G. M. van den Hoek, "The Etch Mechanism for $Al2O3$ in Fluorine and Chlorine Based RF Dry Etch Plasma," Mat. Res. Soc. Symp. Proc., 68, pp. 71-78 (1986).

J. E. Spencer, et al., "Emission Spectroscopy of CC14 and BC13 Plasma During Aluminum Etchning," Proceedings—Electrochemical Society, 82-7, pp. 103-107 (1982).

T. Kanniainen, et al, "Growth of Dielectric $HfO_2/Ta_2O_5$ Thin Film Nanolaminate Capacitors by Atomic Layer Epitaxy," Proceedings—Electrochemical Society, 97-31, pp. 36-46 (1998).

H. B. Bell, et al., "Reactive Ion Etching of Aluminum/Silicon in $BBr3/Cl_2$ and $BCl_3/Cl_2$ Mixtures," Journal of Electrochemical Society, 135(5), pp. 1184-1191 (1988).

Y. S. Lee, et al., "Mass Spectrometic Characterization of $BCl_3/SF_6$ Plasmas," Journal of Applied Physics, 88(8), pp. 4507-4509 (1980).

N. Heiman, et al., "High Rate Reactive Ion Etching of $Al_2O_3$ and Si," J. Vac. Sci. Technol., 17(3), pp. 731-734 (1980).

K. Shibata, et al., "Manufacturing Method and its Equipment of Thin Film Magnetic Head," Japanese Patent Application JP2000251221A (2000).

J. Chen, et al., "Formation of Polycrystalline Silicon Germanium/$HfO_2$ Gate Stack Structure Using Inductively Coupled Plasma Etching," J. Vac. Sci. Technol. A 21(4), pp. 1210-1217 (2003).

* cited by examiner

Relative etch rate comparison for $HfO_2$, $Al_2O_3$, and $ZrO_2$.

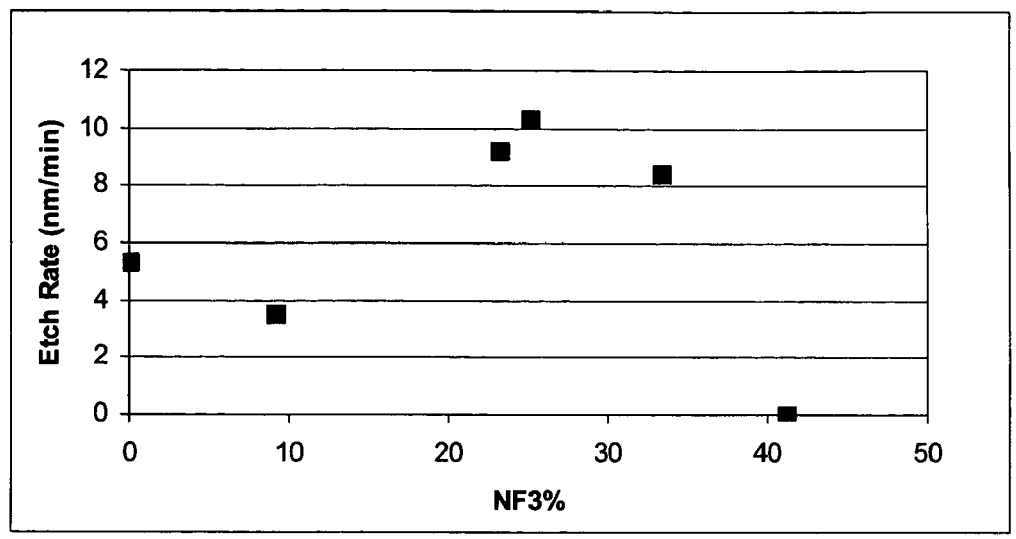
Figure 7a: HfO$_2$ etch rates at different NF$_3$ by volume percentages in the gaseous mixture of BCl$_3$ and NF$_3$.
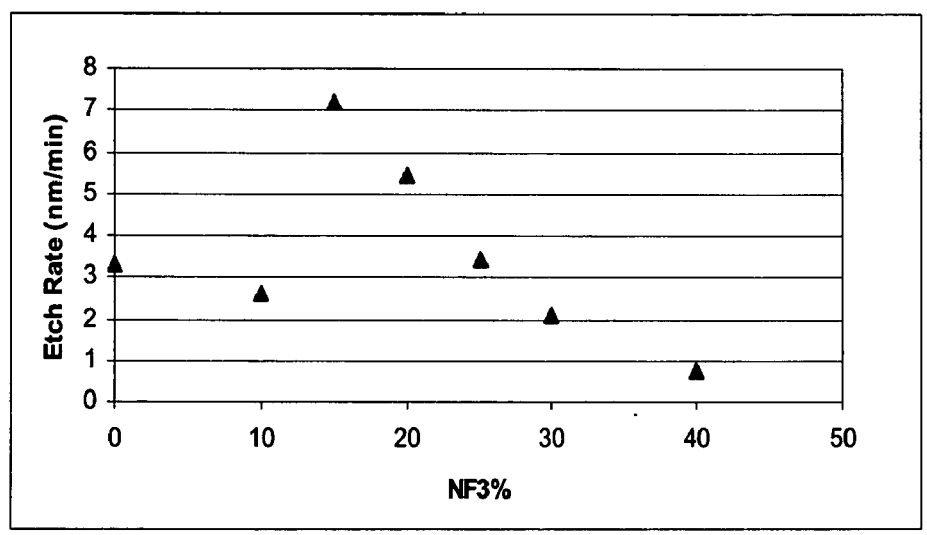
Figure 7b: HfSi$_x$O$_y$ etch rates at different NF$_3$ by volume percentages in the gaseous mixture of BCl$_3$ and NF$_3$.

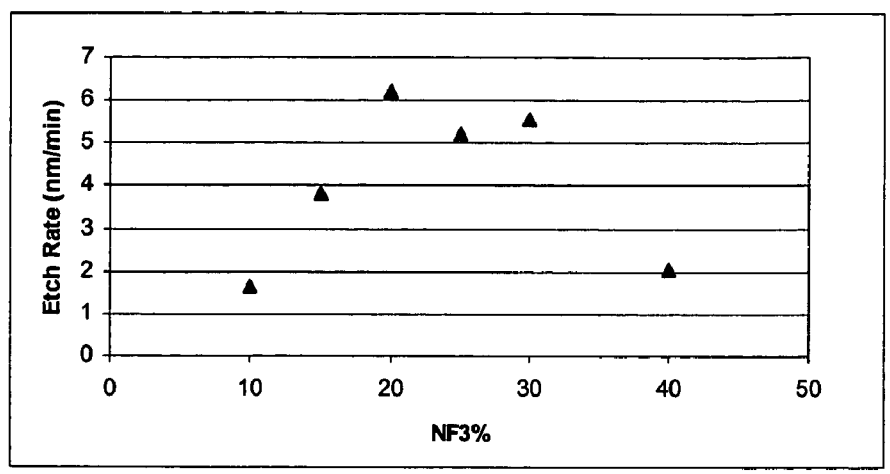
Figure 7c: $ZrO_2$ etch rates at different $NF_3$ by volume percentages in the gaseous mixture of $BCl_3$ and $NF_3$.

METHOD FOR ETCHING HIGH DIELECTRIC CONSTANT MATERIALS AND FOR CLEANING DEPOSITION CHAMBERS FOR HIGH DIELECTRIC CONSTANT MATERIALS

CROSS-REFERENCE TO RELATED APPLICATIONS

This application is a continuation-in-part of U.S. patent application Ser. No. 10/410,803, filed 10 Apr. 2003, which is a continuation-in-part of U.S. patent application Ser. No. 10/198,509, filed 18 Jul. 2002, now abandoned the disclosures of which are incorporated herein by reference in its entirety.

BACKGROUND OF THE INVENTION

In the manufacture of semiconductor integrated circuits (IC), dielectric materials such as silicon dioxide ($SiO_2$), silicon nitride ($Si_3N_4$), and silicon oxynitride (SiON) have been widely used as insulators for transistor gates. Such insulators are often called gate dielectrics. As IC device geometry shrinks, gate dielectric layers have become progressively thinner. When the gate dielectric layer approaches thicknesses of a few nanometers or less, conventional $SiO_2$, $Si_3N_4$, and SiON materials undergo electric breakdown and no longer provide insulation. To maintain adequate breakdown voltage at very small thickness ($\leq 10$ nm), high dielectric constant materials (can be used as the gate insulating layer. The term "high dielectric constant materials" or "high-k materials", as used herein, describe materials where the dielectric constant is greater than about 4.1, or the dielectric constant of silicon dioxide. In addition, high-k materials can also be used as the barrier layer in deep trench capacitors for semiconductor memory chip manufacturing. The IC industry has experimented with many high-k materials. The latest and most promising high-k materials are metal oxides such as $Al_2O_3$, $HfO_2$, $ZrO_2$, and mixtures thereof, and metal silicates such as $HfSi_xO_y$, $ZrSiO_4$, and mixtures thereof. In some instances, nitrogen may be incorporated into these metal oxides and metal silicates high-k materials (such as HfSiON or AlSiON) to improve the dielectric constant and to suppress crystallization of high-k materials. For example, crystallization of high-k materials such as $HfO_2$ causes high leakage current and device failure. Therefore, incorporation of nitrogen can dramatically improve the device reliability. In other instances laminate structures of two or more of the above mentioned materials are deposited as the high k dielectric layer. For example, a laminate structure of $Al_2O_3$ followed by $HfO_2$ is being employed as the barrier layer in deep trench capacitors.

High-k materials such as $Al_2O_3$, $HfO_2$, and $ZrO_2$ are very stable and resistive against most of the etching reactions, which has led to their use as etch stop layers and hard mask layers in plasma etching of other materials. See, e.g., K. K. Shih et al., "Hafnium dioxide etch-stop layer for phase-shifting masks", J. Vac. Sci. Technol. B 11(6), pp. 2130-2131 (1993); J. A. Britten, et al., "Etch-stop characteristics of $Sc_2O_3$ and $HfO_2$ films for multilayer dielectric grating applications", J. Vac. Sci. Technol. A 14(5), pp. 2973-2975 (1996); J. Hong et al., "Comparison of $Cl_2$ and $F_2$ based chemistries for the inductively coupled plasma etching of NiMnSb thin films", J. Vac. Sci. Technol. A 17(4), pp. 1326-1330 (1999); U.S. Pat. No. 5,972,722 to Visokay et al.; U.S. Pat. No. 6,211,035 B1 to Moise et al., U.S. patent application Publication US2001/0055852 A1 to Moise et al.; and EP 1,001,459 A2 to Moise et al.

These high-k materials are typically deposited from chemical precursors that react in a deposition chamber to form films in a chemical vapor deposition (CVD) process. In some instances, these high-k materials are deposited onto semiconductor substrates (wafers) by atomic layer deposition (ALD), in which the films are deposited in controlled, nearly monoatomic layers. Apparatus and processes for performing ALD are disclosed in, e.g., U.S. Pat. No. 5,879,459 to Gadgil et al., U.S. Pat. No. 6,174,377 B1 to Doering et al., U.S. patent application Publication US2001/0011526 A1 to Doering et al., U.S. Pat. No. 6,387,185 B2 to Doering et al., WO 00/40772 to Doering et al. and WO 00/79019 A1 to Gadgil et al. This family of patents assigned to Genus, Inc. teaches that "In situ plasma cleans allow the realization of a very long time between maintenance cleaning." (See, e.g., U.S. Pat. No. 6,387,185 B2 at column 7, lines 27-28.) However, no details of any process for plasma cleaning of ALD chambers were given in the above family of disclosures.

Plasma sources have been used to enhance atomic layer deposition processes (PE-ALD). For example, Pomarede et al. in WO 02/43115 A2 teach the use of plasma sources to generate excited reactive species that prepare/activate the substrate surface to facilitate subsequent ALD. Nguyen et al. in WO 02/43114 A2 teach the use of a pulsing plasma to enact ALD processes instead of alternating precursor chemical flows. Again, these publications do not disclose any method to clean the ALD residues after the wafers have been processed.

Although the aforementioned high-k materials are excellent gate insulators, it is very difficult to dry etch these films for pattern transfer. While the deposition process desirably generates high-k films on a substrate (typically a silicon wafer), the reactions that form these films also occur non-productively on other exposed surfaces inside of the deposition chamber. Accumulation of deposition residues results in particle shedding, degradation of deposition uniformity, and processing drifts. These effects can lead to wafer defects and subsequent device failure. Therefore, all CVD chambers, and specifically ALD chambers, must be periodically cleaned.

Due to their extreme chemical inertness, there have been few attempts to dry etch these high-k materials. J. W. Lee et al. in "Electron cyclotron resonance plasma etching of oxides and SrS and ZnS-based electroluminescent materials for flat panel displays", J. Vac. Sci. Technol. A 16(3), pp. 1944-1948 (1998), reported several chemistries to etch various metal oxides and sulfides. The authors used very powerful plasma conditions (800 W of microwave source power, up to 450 W of RF chuck bias power, and chamber pressure of 1.5 mTorr). The result of such process conditions is very high chuck bias voltage (up to 535 V). High chuck bias voltage can greatly enhance energetic ion sputtering and sputter induced etching. The authors used $Cl_2$/Ar, $BCl_3$/Ar, and $SF_6$/Ar mixture under the extreme plasma conditions to etch various materials. $Al_2O_3$ showed the slowest etch rates. In most of their experiments, $Al_2O_3$ etch rates were less than 20% of the ZnS etch rates under identical conditions. The authors also noted "Fairly similar trends were seen with $BCl_3$/Ar discharges, with the absolute rates being ~20% lower than that for $Cl_2$/Ar." While the authors' method may be used for anisotropic etching of flat panel display devices, high power plasma sputtering cannot be achieved on grounded chamber surfaces. Therefore, the authors' methods cannot be extended to clean deposition residues within ALD chambers.

Williams et al. in U.S. Pat. No. 6,238,582 B1 teach a reactive ion beam etching (RIBE) method to etch thin film head materials such as $Al_2O_3$. The patentees used a $CHF_3/Ar$ plasma as the ion source. A collimated reactive ion beam impinges upon the wafer substrate to etch thin film materials. Such collimated ion beams cannot be used to clean deposition residues from ALD chambers.

Lagendijk et al. in U.S. Pat. Nos. 5,298,075 and 5,288,662 teach a "process for thermal oxidation of silicon or cleaning of furnace tubes . . . by exposing the silicon or tube to temperatures above 700° C. while flowing a carrier gas containing oxygen and a chlorohydrocarbon having a general formula $C_xH_xCl_x$ where x is 2, 3, or 4 over the silicon or tube. The chlorohydrocarbon is selected to readily and completely oxidize at temperature." (See Abstract.) Oxidation of silicon into $SiO_2$ and gettering metal contaminants (such as Na and Fe) in oxidation or diffusion furnaces is a completely different process than etching/cleaning high-k materials.

Various references discuss adding certain compounds to the plasma in order to effect the etch rate of $Al_2O_3$. The references, W. G. M. Van Den Hoek, "The Etch Mechanism for $Al_2O_3$ in Fluorine and Chlorine Based RF Dry Etch Plasmas". Met. Res. Soc. Symp. Proc. Vol. 68 (1986), pp. 71-78 and Heiman, et al., "High Rate Reactive Ion Etching of $Al_2O_3$ and Si", J. Vac. Sci. Tech., 17(3), May/June 1980, pp. 731-34, disclose adding a fluorine based gas or a chlorine based gas, respectively, to an Ar plasma to increase the etch rate of $Al_2O_3$. However, these studies were all under the reactive ion etch (RIE) conditions. Ion bombardment/sputter induced reactions play a much large role than chemical etching reactions. Like other prior arts, such extreme RIE conditions do not apply to cleaning grounded chamber surfaces.

In view of the dearth of art disclosing methods for removing high-k dielectric residues, ALD reactors have typically been cleaned by mechanical means (scrubbing or blasting) to clean up the deposition residues from the internal surfaces of the chamber and downstream equipment (e.g. pump headers and exhaust manifolds). However, mechanical cleaning methods are time-consuming, labor-intensive, and damaging to the surfaces being cleaned.

Fluorine-containing plasma-based processes (i.e., dry cleaning) are commonly used to remove residues of silicon compounds (such as polycrystalline silicon, $SiO_2$, SiON, and $Si_3N_4$) and tungsten from the interior surfaces of chemical vapor deposition (CVD) reactors. Here, fluorine reacts with the aforementioned residues to produce, for example, $SiF_4$ or $WF_6$, volatile species that can be pumped out of the reactor during the cleaning process. However, fluorine-based chemistry alone is ineffective to remove the high-k dielectric materials discussed above. See, e.g., J. Hong et al., J. Vac. Sci. Technol. A, Vol. 17, pp 1326-1330, 1999, wherein the authors exposed $Al_2O_3$ coated wafers to $NF_3/Ar$ based inductively coupled plasmas, and found that "the greater concentration of atomic F available at high source power contributed to thicker fluorinated surfaces, leading to the net deposition rather than etching." In the case of high-k materials the metal fluoride product that forms is nonvolatile and, thus, difficult to remove from the reactor.

Thus, there is an urgent need for a process to chemically dry clean high-k material residues, such as $Al_2O_3$, $HfO_2$, $ZrO_2$, $HfSi_xO_y$, $ZrSi_xO_y$, and mixtures thereof, residues of laminates containing high-k materials such as $HfO_2$ and $Al_2O_3$ (also referred to as HfAlO), and residues from nitrogen containing high-k material such as HfON, AlON, and laminated materials between HfON and AlON (HfAlON), from ALD chambers without venting/opening up the chamber. An effective chemical dry cleaning method will significantly increase the productivity and lower the cost-of-ownership (CoO) for ALD-based deposition processes.

All references cited herein are incorporated herein by reference in their entireties.

BRIEF SUMMARY OF THE INVENTION

A process for removing a substance from a substrate and a mixture for accomplishing the same are disclosed herein. In one aspect, there is provided a process for cleaning a substance from a reactor surface comprising: providing a reactor containing the reactor surface, wherein: (a) the reactor surface is at least partially coated with a film of the substance; (b) the substance is at least one member selected from the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer selected from the group consisting of a transition metal oxide, a transition metal silicate, a Group 13 metal oxide, a Group 13 metal silicate, a nitrogen containing transition metal oxide, a nitrogen containing transition metal silicate, a nitrogen containing Group 13 metal oxide, or a nitrogen containing Group 13 metal silicate; and (c) the substance has a dielectric constant greater than the dielectric constant of silicon dioxide; reacting the substance with a reactive agent to form a volatile product, wherein the reactive agent comprises at least one member selected from the group consisting of a halogen-containing compound; a boron-containing compound, a carbon-containing compound, a hydrogen-containing compound, a nitrogen-containing compound, a chelating compound, a chlorosilane compound, a hydrochlorosilane compound, or an organochlorosilane compound; and removing the volatile product from the reactor to thereby remove the substance from the surface.

In another aspect, there is provided a process for removing a substance from a surface of a reaction chamber comprising: providing a reaction chamber wherein at least a portion of the surface is at least partially coated with the substance and wherein the substance has a dielectric constant of 4.1 or greater and is at least one member of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate; introducing a reactive agent into the reaction chamber wherein the reactive agent comprises at least one member selected from the group consisting of a halogen-containing compound; a boron-containing compound, a carbon-containing compound, a hydrogen-containing compound, a nitrogen-containing compound, a chelating compound, a chlorosilane compound, a hydrochlorosilane compound, or an organochlorosilane compound; exposing the reactive agent to one or more energy sources sufficient to react the substance with the reactive agent and form a volatile product; and removing the volatile product from the reaction chamber.

In yet another aspect of the present invention, there is provided an apparatus for removing a substance from at least one surface of a reactor comprising: an at least one reactive agent selected from the group consisting of a halogen-containing compound; a boron-containing compound, a carbon-containing compound, a hydrogen-containing compound, a nitrogen-containing compound, a chelating compound, a chlorosilane compound, a hydrochlorosilane compound, or an organochlorosilane compound; and a non-reactive support having the at least one reactive agent deposited thereupon.

In a further aspect of the present invention, there is provided a mixture for removing a substance from at least one surface of a reactor comprising: an at least one reactive agent selected from the group consisting of a halogen-containing compound; a boron-containing compound, a carbon-containing compound, a hydrogen-containing compound, a nitrogen-containing compound, a chelating compound, a chlorosilane compound, a hydrochlorosilane compound, or an organochlorosilane compound; and an inert diluent.

In yet another aspect of the present invention, there is provided a process for removing a substance from an at least one surface of a substrate comprising: providing the substrate wherein the substrate is at least partially coated with a film of the substance that is at least one member selected from the group consisting of a transition metal oxide, a transition metal silicate, a Group 13 metal oxide other than $Al_2O_3$, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, or a nitrogen containing transition metal silicate; and wherein the substance has a dielectric constant greater than a dielectric constant of silicon dioxide; reacting the substance with a reactive agent to form a volatile product, wherein the reactive agent comprises at least one member from the group consisting of a halogen-containing compound; a boron-containing compound, a carbon-containing compound, a hydrogen-containing compound, a nitrogen-containing compound, a chelating compound, a chlorosilane compound, a hydrochlorosilane compound, or an organochlorosilane compound; and removing the volatile product from the substrate to thereby remove the substance from the substrate.

In yet another aspect of the present invention, there is provided a process for cleaning a substance from a reactor surface comprising: providing a reactor containing the reactor surface, wherein: (a) the reactor surface is at least partially coated with a film of the substance; (b) the substance silicate; and oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer selected from the group consisting of a transition metal oxide, a transition metal silicate, a Group 13 metal oxide, a Group 13 metal silicate, a nitrogen containing transition metal oxide, a nitrogen containing transition metal silicate, a nitrogen containing Group 13 metal oxide, or a nitrogen containing Group 13 metal silicate; and (c) the substance has a dielectric constant greater than the dielectric constant of silicon dioxide; reacting the substance with a reactive agent comprising at least one fluorine-containing compound and at least one selected from a chlorine-containing compound, a bromine-containing compound, or a iodine-containing compound wherein the fluorine-containing compound is less than 50% by volume of an amount of the reactive agent; and removing the volatile product from the reactor to thereby remove the substance from the surface.

These and other aspects of the invention will become apparent from the following detailed description.

BRIEF DESCRIPTION OF SEVERAL VIEWS OF THE DRAWINGS

FIGS. 7a through 7c illustrate the $HfO_2$, $HfSi_xO_y$, and $ZrO_2$ etch rates, respectively, at different $NF_3$ percentages in the mixture of $BCl_3$ and $NF_3$ for one embodiment of the present invention.

DETAILED DESCRIPTION OF THE INVENTION

Figure 1A:
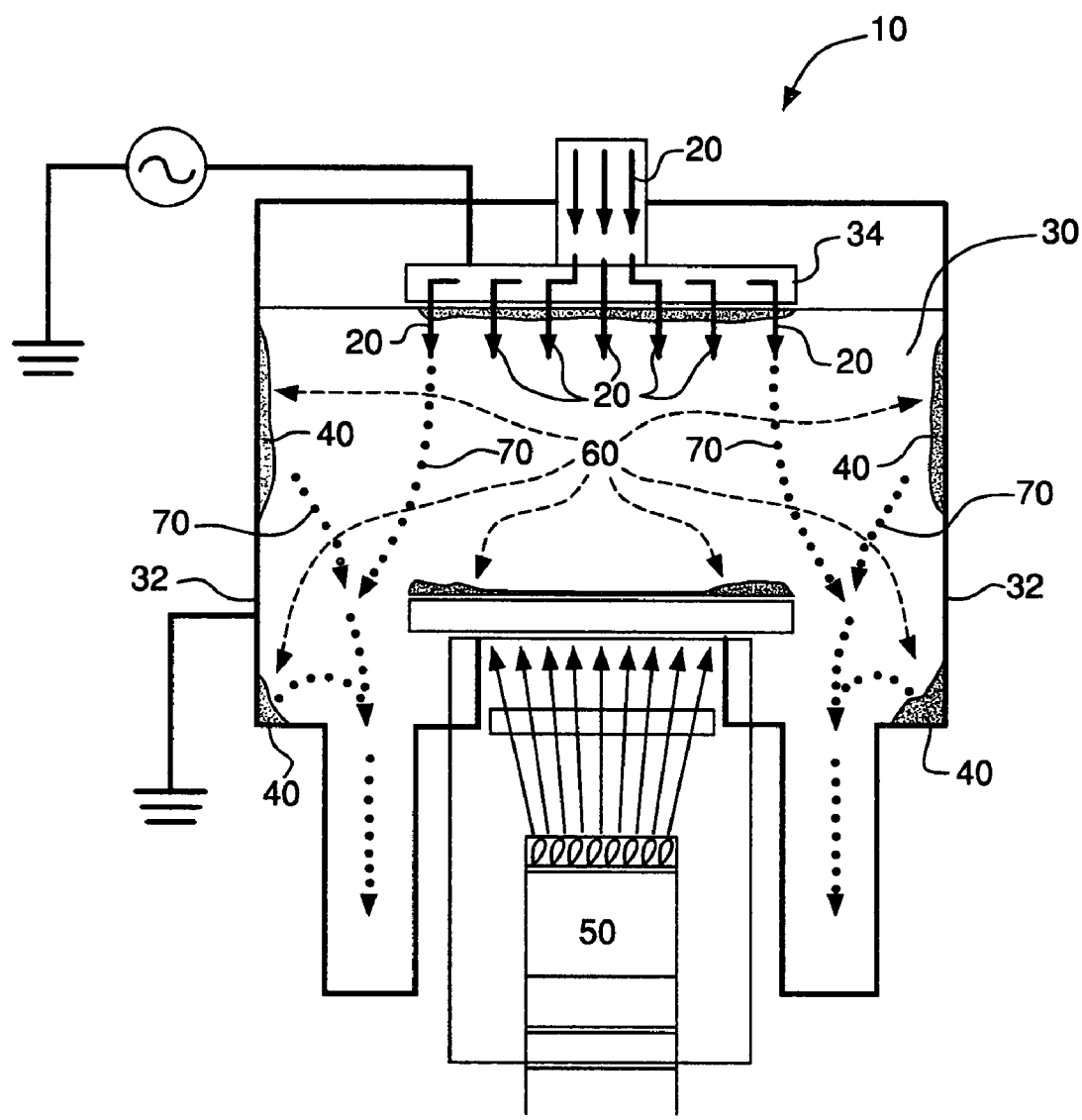
FIGS. 1a and 1b provides an illustration of an apparatus suitable for performing chamber cleaning using an internal energy source or a remote energy source, respectively.

The present process is useful for dry-etching high-k materials and dry-cleaning chemical vapor deposition (CVD) chambers (and more specifically, ALD chambers) used to deposit high-k materials onto wafer surfaces. The material to be removed from the surface being etched or cleaned is converted from a solid non-volatile material into materials having higher volatility than the high-k materials deposited thereupon and can be subsequently removed, for example, by reactor vacuum pumps. Thus, the invention removes a substance from a substrate using one or more reactive agents to volatilize the substance. Unlike wet-etching and wet-cleaning processes, dry-etching and dry-cleaning processes do not immerse the substrate in or expose the substrate to liquid chemical solutions.

In certain embodiments, the substance to be removed can be a transition metal oxide, a transition metal silicate, a Group 13 metal oxide or a Group 13 metal silicate (in accordance with the IUPAC Nomenclature of Inorganic Chemistry, Recommendations 1990, Group 13 metals include Al, Ga, In and Tl, and the transition metals occupy Groups 3-12). The substance may be a high-k material having a dielectric constant greater than that of silicon dioxide (i.e., greater than about 4.1), or greater than 5, or at least 7. Preferably, the substance is at least one member selected from the group consisting of $Al_2O_3$, $HfO_2$, $ZrO_2$, $HfSi_xO_y$, $ZrSi_xO_y$, and mixtures thereof. Those skilled in the art will appreciate that the formula $HfSi_xO_y$ (and the formula $ZrSi_xO_y$) represents a mixture of $HfO_2$ ($ZrO_2$) and $SiO_2$, where x is greater than 0 and y is 2x+2.

In other embodiments of the present invention, the substance may be a laminate comprising layers of at least one member selected from the group of the following materials: a transition metal oxide, a transition metal silicate, a Group 13 metal oxide, a Group 13 metal silicate, a nitrogen containing transition metal oxide, a nitrogen containing transition metal silicate, a nitrogen containing Group 13 metal oxide, or a nitrogen containing Group 13 metal silicate. The laminate is preferably alternating between at least one of the foregoing materials and, optionally, other materials such as insulating materials. For example, the laminate may be comprised of alternating layers of $HfO_2$ and $Al_2O_3$. The laminate may also consist of a certain number of layers of a first material and a certain number of layers of a second material or, alternatively, outer layers of at least one first material and inner layers of at least one second material.

In yet a further embodiment of the present invention, the substance may be a nitrogen containing material such as a nitrogen containing transition metal oxide, a nitrogen containing transition metal silicate, a nitrogen containing Group 13 metal oxide, or a nitrogen containing Group 13 metal silicate. An example of this type of substance includes HfAlON.

As mentioned previously, the substance to be removed is reacted with a reactive agent to form a volatile product which can be readily removed from the substrate. In certain preferred embodiments, the reactive agent may be exposed to one or more energy sources sufficient to form active species such as ions, radicals, excited neutrals, and the like, which react with the substance and form the volatile product. Examples of suitable reactive agents include: a halogen-containing compound such as a chloride, bromide, fluoride, or iodide compound; a boron-containing compound, a carbon-containing compound, a hydrogen-containing compound, a nitrogen-containing compound, a chelating compound, a chlorosilane compound, a hydrochlorosilane compound, an organochlorosilane compound, or a mixture thereof. Although the reactive agents used herein may be sometimes described as "gaseous", it is understood that the chemical reagents may be delivered directly as a gas to the reactor, delivered as a vaporized liquid, a sublimed solid and/or transported by an inert diluent gas into the reactor.

The reactive agents can be delivered to the reaction chamber by a variety of means, such as, for example, conventional cylinders, safe delivery systems, vacuum delivery systems, solid or liquid-based generators that create the reactive agent at the point of use. In one embodiment of the present invention, at least one reactive agent can be added to a non-reactive liquid or gaseous diluent and applied to the substrate having the substance to be removed as a spray or other means. The reactive agent can react with the substance to form the volatile product upon exposure to one or more energy sources. In an alternative embodiment such as for chamber cleaning applications, the reactive agent(s) can be deposited onto a non-reactive support which can be introduced into the reaction chamber. The material of the non-reactive support is one that will not react with the reactive agent prior to or during exposure to one of energy sources. In certain preferred embodiments, the non-reactive support has a plurality of pores. The reactive agent(s) can be released upon exposure to one or more energy sources and react with the substance to be removed to form the volatile product.

Since the chlorides of these metals (such as $AlCl_3$, $HfCl_4$, $ZrCl_4$, and $SiCl_4$) are more volatile, it may be preferrable to convert these high-k substances into chlorides. This conversion is accomplished by contacting the substance to be removed with a reactive agent containing chlorine. Examples of chlorine-containing reactive agents include $BCl_3$, $COCl_2$, HCl, $Cl_2$, $ClF_3$, and $NF_zCl_{3-z}$, where z is an integer from 0 to 2, chlorocarbons, and chlorohydrocarbons (such as $C_xH_yCl_z$ where x is a number ranging from 1 to 6, y is a number ranging from 0 to 13, and z is a number ranging from 1 to 14). Chlorine-containing reactive agents that also contain oxygen-getter functions, such as $BCl_3$, $COCl_2$, chlorocarbons and chlorohydrocarbons, may be suitable in certain embodiments because the oxygen-getter component (B, CO, C, or H) in these molecules extracts oxygen from the high-k materials and hence enhances the conversion of metal oxides and metal silicates into metal chlorides. Among the chlorine-containing and oxygen-getter gases, $BCl_3$ is the most preferred one. In embodiments employing $COCl_2$ as the reactive agent it can be provided in prepared form or formed by an in situ reaction of CO and $Cl_2$. In certain embodiments, the reactive agent can comprise a chlorine-containing gas and a fluorine-containing gas (e.g., $BCl_3$ and $BF_3$), or a gas containing both fluorine and chlorine such as $ClF_3$, and $NF_zCl_{3-z}$, where z is an integer from 0 to 2.

In alternative embodiments, one or more chlorine-containing reactive agents can be combined with one or more other halogen-containing compounds such as one or more fluorine-containing reactive agents to aid in etching and removing high-k materials. Although the fluorides of transition metals such $HfF_4$ and $ZrF_4$ are less volatile than the corresponding chlorides, it is surprising and unexpected that adding at least one fluorine-containing reactive agent to chlorine-containing reactive agent may enhance the etch rate of high dielectric constant transition metal oxides. In these embodiments, the gaseous mixture may comprise less than 50% by volume of at least one fluorine-containing reactive agent; at least one chlorine-containing reactive agent; and optionally inert diluent gas. An exemplary gas mixture may comprise from about 1% to less than 50% by volume of at least one fluorine-containing compound and from about 50% to about 99% by volume of at least one chlorine-containing compound. The fluorine-containing reactive agent(s) may be combined with the chlorine-containing reactive agent(s) to provide the mixture prior to or after introduction to the reactor. Examples of suitable fluorine-containing reactive agents include $NF_3$ (nitrogen trifluoride), $ClF_3$ (chlorine trifluoride), ClF (chlorine fluoride), $SF_6$ (sulfur hexafluoride), perfluorocarbons such as $CF_4$ and $C_2F_6$ etc, hydrofluorocarbons such as $CHF_3$ and $C_3F_7H$ etc., oxyfluorocarbons such as $C_4F_8O$ (perfluorotetrahydrofuran) etc., hypofluorites such as $CF_3$—OF (fluoroxytrifluoromethane (FTM)) and FO—$CF_2$—OF (bis-difluoroxy-difluoromethane (BDM)) etc., fluoroperoxides such as $CF_3$—O—O—$CF_3$, F—O—O—F etc., fluorotrioxides such as $CF_3$—O—O—O—$CF_3$ etc., $COF_2$ (carbonyl fluoride), NOF, $NF_xCl_{3-x}$, where x is an integer from 1 to 2, and $F_2$ etc. Exemplary gaseous mixtures include, but are not limited to, $BCl_3$ and $NF_3$; $BCl_3$ and $F_2$; $BCl_3$ and $ClF_3$; $BCl_3$ and $NF_xCl_{3-x}$ where x is an integer from 1 to 2. Other Cl-, Br-, or I- containing compounds such as, for example, any of the compounds disclosed herein, may also have this synergistic effect with the F- containing compounds.

In addition to the reactive agents described herein, inert diluent gases such as nitrogen, CO, helium, neon, argon, krypton, and xenon etc. can also be added. Inert diluent gases can modify the plasma characteristics and cleaning processes to better suit some specific applications. The concentration of the inert gases can range from 0 to 99%.

Figure 3:
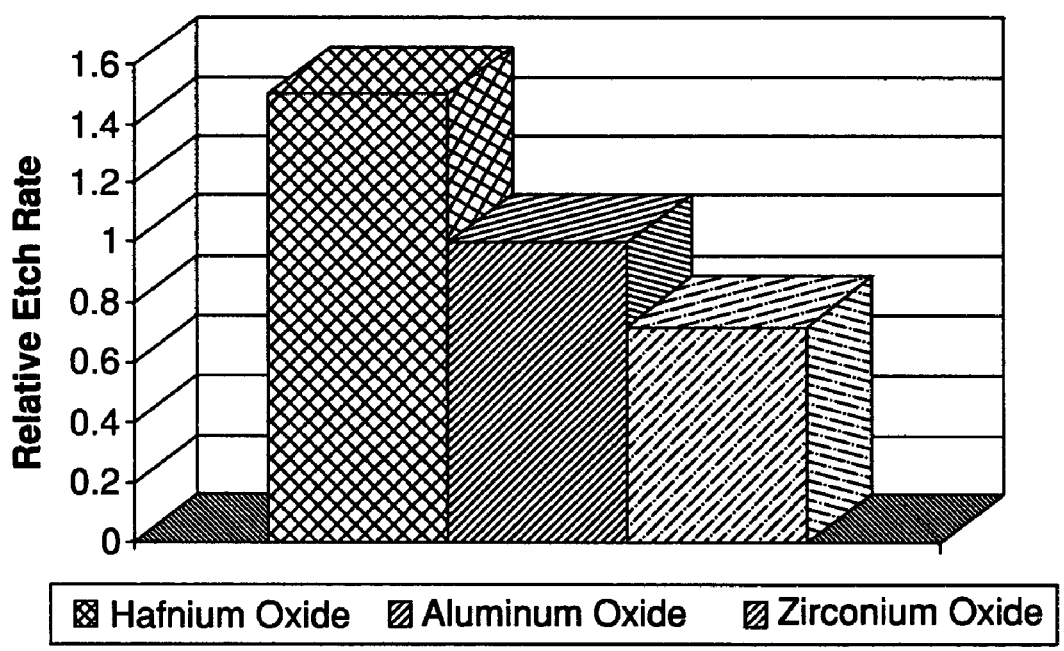
FIG. 3 provides a graphical illustration of the relative $BCl_3$ plasma etch rates of various high dielectric constant materials, normalized to $Al_2O_3$.

The process of the invention is useful for etching substances from the surfaces of a substrate. Thus, suitable substrates for the etching embodiments of the invention include, e.g., semiconductor wafers and the like. FIG. 3 shows a comparison of the relative etch rate of hafnium oxide, aluminum oxide, and zirconium oxide for one embodiment of the present invention using $BCl_3$ as the reactive agent.

The present invention may be also suitable for cleaning substances from substrates such as surfaces of reaction chambers for CVD and/or ALD processes. The present invention is particularly suited for removing high k substances that have deposited onto the exposed surfaces of a reaction chamber such as, for example, the workpiece platform, grounded sidewalls, and/or showerhead of a typical reaction chamber.

The one or more reactive agents are exposed to one or more energy sources sufficient to generate active species to at least partially react with the substance and/or boron-containing by-products and form volatile species. The energy source for the exposing step may include, but not be limited to, α-particles, β-particles, γ-rays, x-rays, high energy electron, electron beam sources of energy; ultraviolet (wavelengths ranging from 10 to 400 nm), visible (wavelengths ranging from 400 to 750 nm), infrared (wavelengths ranging from 750 to $10^5$ nm), microwave (frequency>$10^9$ Hz), radio-frequency wave (frequency>$10^6$ Hz) energy; thermal; RF, DC, arc or corona discharge; sonic, ultrasonic or megasonic energy; and mixtures thereof.

In certain embodiments, thermal or plasma activation and/or enhancement can significantly impact the efficacy of dry etching and dry cleaning of high dielectric constant materials. For thermal activation, the substrate can be heated up to 600° C., or up to 400° C., or up to 300° C. The pressure range is generally 10 mTorr to 760 Torr, or 1 Torr to 760 Torr.

In alternative embodiments, the reactive agent(s) are activated by a plasma in situ or within the reactor containing the substance to be removed. For in situ plasma activation, one can generate the plasma with a 13.56 MHz RF power supply, with RF power density at least 0.2 W/cm², or at least 0.5 W/cm², or at least 1 W/cm². One can also operate the in situ plasma at RF frequencies lower than 13.56 MHz to enhance ion assisted cleaning of grounded ALD chamber walls. The operating pressure is generally in the range of 2.5 mTorr to 100 Torr, or 5 mTorr to 50 Torr, or 10 mTorr to 20 Torr. Optionally, one can also combine thermal and plasma enhancement for more effective cleaning of ALD chamber walls.

One can also use a remote plasma source to replace an in situ plasma to generate more reactive species. The remote plasma source can be generated by either an RF or a microwave source. In addition, reactions between remote plasma generated reactive species and high-k materials can be activated/enhanced by heating ALD reactor components to elevated temperatures up to 600° C., or to 400° C., or up to 300° C.

Other means of activation and enhancement to the cleaning processes can also be employed. For example, one can use photon induced chemical reactions to generate reactive species and enhance the etching/cleaning reactions.

The following tables show thermochemical calculations for various reactions for volatilizing the substance to be removed from the substrate. In these tables, $K_{eq}$ represents the equilibrium constant for the reaction as written; so that the larger this value is, the more favorable the reaction will be to proceed.

TABLE 1

$Al_2O_3$ reaction with $BCl_3$: $Al_2O_3 + 2BCl_3(g) \leftrightarrow B_2O_3 + 2AlCl_3(g)$

| Temperature (° C.) | ΔH (Kcal) | ΔS (Cal) | ΔG (Kcal) | $K_{eq}$ |
|---|---|---|---|---|
| 0.000 | 9.561 | 12.274 | 6.208 | 1.078E−005 |
| 100.000 | 9.547 | 12.249 | 4.976 | 1.217E−003 |
| 200.000 | 9.424 | 11.959 | 3.766 | 1.822E−002 |
| 300.000 | 9.299 | 11.719 | 2.582 | 1.036E−001 |
| 400.000 | 9.196 | 11.553 | 1.419 | 3.461E−001 |
| 500.000 | 15.123 | 19.739 | −0.138 | 1.094E+000 |
| 600.000 | 15.476 | 20.169 | −2.135 | 3.422E+000 |
| 700.000 | 15.748 | 20.464 | −4.167 | 8.629E+000 |
| 800.000 | 15.951 | 20.664 | −6.224 | 1.852E+001 |
| 900.000 | 16.097 | 20.794 | −8.298 | 3.515E+001 |
| 1000.000 | 16.190 | 20.871 | −10.381 | 6.056E+001 |

TABLE 2

$HfO_2$ reaction with $BCl_3$: $1.5HfO_2 + 2BCl_3(g) \leftrightarrow 1.5HfCl_4(g) + B_2O_3$

| Temperature (° C.) | ΔH (Kcal) | ΔS (Cal) | ΔG (Kcal) | $K_{eq}$ |
|---|---|---|---|---|
| 0.000 | −17.999 | −12.638 | −14.547 | 4.367E+011 |
| 25.000 | −18.003 | −12.653 | −14.231 | 2.707E+010 |
| 50.000 | −18.025 | −12.721 | −13.914 | 2.576E+009 |
| 75.000 | −18.057 | −12.817 | −13.595 | 3.426E+008 |
| 100.000 | −18.096 | −12.924 | −13.273 | 5.950E+007 |
| 125.000 | −18.138 | −13.034 | −12.948 | 1.283E+007 |
| 150.000 | −18.182 | −13.141 | −12.621 | 3.305E+006 |
| 175.000 | −18.226 | −13.242 | −12.291 | 9.879E+005 |
| 200.000 | −18.268 | −13.335 | −11.959 | 3.346E+005 |

TABLE 3

$ZrO_2$ reaction with $BCl_3$: $1.5ZrO_2 + 2BCl_3(g) \leftrightarrow 1.5ZrCl_4(g) + B_2O_3$

| Temperature (° C.) | ΔH (Kcal) | ΔS (Cal) | ΔG (Kcal) | $K_{eq}$ |
|---|---|---|---|---|
| 0.000 | −29.845 | −12.107 | −26.538 | 1.717E+021 |
| 25.000 | −29.825 | −12.038 | −26.236 | 1.710E+019 |
| 50.000 | −29.822 | −12.026 | −25.935 | 3.481E+017 |
| 75.000 | −29.828 | −12.047 | −25.634 | 1.239E+016 |
| 100.000 | −29.842 | −12.083 | −25.333 | 6.891E+014 |
| 125.000 | −29.858 | −12.126 | −25.030 | 5.502E+013 |
| 150.000 | −29.875 | −12.168 | −24.726 | 5.913E+012 |
| 175.000 | −29.892 | −12.207 | −24.422 | 8.142E+011 |
| 200.000 | −29.908 | −12.240 | −24.116 | 1.381E+011 |

TABLE 4

$HfO_2$ reaction with $COCl_2$: $HfO_2 + 2COCl_2(g) \leftrightarrow HfCl_4(g) + 2CO_2(g)$

| Temperature (° C.) | ΔH (Kcal) | ΔS (Cal) | ΔG (Kcal) | $K_{eq}$ |
|---|---|---|---|---|
| 0.000 | −20.643 | 41.960 | −32.105 | 4.890E+025 |
| 25.000 | −20.649 | 41.940 | −33.153 | 2.014E+024 |
| 50.000 | −20.668 | 41.878 | −34.201 | 1.357E+023 |
| 75.000 | −20.699 | 41.787 | −35.247 | 1.343E+022 |
| 100.000 | −20.739 | 41.677 | −36.290 | 1.806E+021 |

TABLE 4-continued

HfO$_2$ reaction with COCl$_2$: HfO$_2$ + 2COCl$_2$(g) ↔ HfCl$_4$(g) + 2CO$_2$(g)

| Temperature (° C.) | ΔH (Kcal) | ΔS (Cal) | ΔG (Kcal) | K$_{eq}$ |
|---|---|---|---|---|
| 125.000 | −20.786 | 41.554 | −37.331 | 3.112E+020 |
| 150.000 | −20.840 | 41.423 | −38.368 | 6.578E+019 |
| 175.000 | −20.900 | 41.285 | −39.402 | 1.647E+019 |
| 200.000 | −20.965 | 41.144 | −40.432 | 4.757E+018 |

TABLE 5

ZrO$_2$ reaction with COCl$_2$: ZrO$_2$ + 2COCl$_2$(g) ↔ ZrCl$_4$(g) + 2CO$_2$(g)

| Temperature (° C.) | ΔH (Kcal) | ΔS (Cal) | ΔG (Kcal) | K$_{eq}$ |
|---|---|---|---|---|
| 0.000 | −28.540 | 42.313 | −40.098 | 1.218E+032 |
| 25.000 | −28.530 | 42.350 | −41.157 | 1.483E+030 |
| 50.000 | −28.533 | 42.341 | −42.215 | 3.573E+028 |
| 75.000 | −28.547 | 42.300 | −43.273 | 1.469E+027 |
| 100.000 | −28.569 | 42.238 | −44.330 | 9.244E+025 |
| 125.000 | −28.599 | 42.160 | −45.385 | 8.215E+024 |
| 150.000 | −28.636 | 42.071 | −46.438 | 9.694E+023 |
| 175.000 | −28.678 | 41.975 | −47.489 | 1.448E+023 |
| 200.000 | −28.724 | 41.873 | −48.537 | 2.638E+022 |

TABLE 6

ZrSiO$_4$ reaction with BCl$_3$: ZrSiO$_4$ + 2.667BCl$_3$(g) ↔ SiCl$_4$(g) + ZrCl$_4$(g) + 1.333B$_2$O$_3$

| Temperature (° C.) | ΔH (Kcal) | ΔS (Cal) | ΔG (Kcal) | K$_{eq}$ |
|---|---|---|---|---|
| 0.000 | −31.065 | −21.096 | −25.303 | 1.764E+020 |
| 25.000 | −31.003 | −20.879 | −24.778 | 1.460E+018 |
| 50.000 | −30.962 | −20.747 | −24.258 | 2.554E+016 |
| 75.000 | −30.935 | −20.665 | −23.740 | 8.020E+014 |
| 100.000 | −30.916 | −20.613 | −23.224 | 4.013E+013 |
| 125.000 | −30.902 | −20.577 | −22.710 | 2.928E+012 |
| 150.000 | −30.891 | −20.549 | −22.196 | 2.914E+011 |
| 175.000 | −30.879 | −20.523 | −21.682 | 3.755E+010 |
| 200.000 | −30.867 | −20.496 | −21.169 | 6.012E+009 |
| 225.000 | −30.852 | −20.466 | −20.657 | 1.158E+009 |
| 250.000 | −30.835 | −20.432 | −20.146 | 2.612E+008 |
| 275.000 | −30.814 | −20.393 | −19.636 | 6.754E+007 |
| 300.000 | −30.790 | −20.349 | −19.127 | 1.967E+007 |
| 325.000 | −30.761 | −20.300 | −18.618 | 6.358E+006 |
| 350.000 | −30.729 | −20.247 | −18.112 | 2.252E+006 |
| 375.000 | −30.692 | −20.190 | −17.606 | 8.652E+005 |
| 400.000 | −30.652 | −20.130 | −17.102 | 3.572E+005 |
| 425.000 | −30.608 | −20.066 | −16.600 | 1.573E+005 |
| 450.000 | −22.891 | −9.391 | −16.100 | 7.349E+004 |
| 475.000 | −22.663 | −9.081 | −15.869 | 4.327E+004 |
| 500.000 | −22.443 | −8.791 | −15.646 | 2.649E+004 |

TABLE 7

ZrSiO$_4$ reaction with BF$_3$ and BCl$_3$: ZrSiO$_4$ + 1.333BF$_3$(g) + 1.333BCl$_3$(g) ↔ SiF$_4$(g) + ZrCl$_4$(g) + 1.333B$_2$O$_3$

| Temperature (° C.) | ΔH (Kcal) | ΔS (Cal) | ΔG (Kcal) | K$_{eq}$ |
|---|---|---|---|---|
| 0.000 | −25.010 | −21.014 | −19.270 | 2.627E+015 |
| 25.000 | −24.951 | −20.807 | −18.748 | 5.540E+013 |
| 50.000 | −24.912 | −20.681 | −18.229 | 2.136E+012 |
| 75.000 | −24.885 | −20.600 | −17.713 | 1.319E+011 |
| 100.000 | −24.865 | −20.545 | −17.199 | 1.186E+010 |
| 125.000 | −24.849 | −20.502 | −16.686 | 1.445E+009 |
| 150.000 | −24.833 | −20.463 | −16.174 | 2.260E+008 |
| 175.000 | −24.816 | −20.423 | −15.663 | 4.354E+007 |
| 200.000 | −24.796 | −20.380 | −15.153 | 9.992E+006 |

TABLE 7-continued

ZrSiO$_4$ reaction with BF$_3$ and BCl$_3$: ZrSiO$_4$ + 1.333BF$_3$(g) + 1.333BCl$_3$(g) ↔ SiF$_4$(g) + ZrCl$_4$(g) + 1.333B$_2$O$_3$

| Temperature (° C.) | ΔH (Kcal) | ΔS (Cal) | ΔG (Kcal) | K$_{eq}$ |
|---|---|---|---|---|
| 225.000 | −24.772 | −20.332 | −14.644 | 2.661E+006 |
| 250.000 | −24.745 | −20.278 | −14.136 | 8.053E+005 |
| 275.000 | −24.712 | −20.218 | −13.630 | 2.721E+005 |
| 300.000 | −24.675 | −20.152 | −13.125 | 1.012E+005 |
| 325.000 | −24.633 | −20.080 | −12.622 | 4.095E+004 |
| 350.000 | −24.586 | −20.003 | −12.121 | 1.784E+004 |
| 375.000 | −24.535 | −19.922 | −11.622 | 8.303E+003 |
| 400.000 | −24.478 | −19.837 | −11.125 | 4.095E+003 |
| 425.000 | −24.418 | −19.749 | −10.630 | 2.128E+003 |
| 450.000 | −16.684 | −9.050 | −10.139 | 1.160E+003 |
| 475.000 | −16.439 | −8.717 | −9.917 | 7.894E+002 |
| 500.000 | −16.201 | −8.405 | −9.703 | 5.535E+002 |

Tables 1-7 show that BCl$_3$ and COCl$_2$ can be used as the etchants for dry etching and cleaning of the high-k materials. BCl$_3$ (boron trichloride) is a liquefied gas at room temperature and can be readily delivered into ALD reactors for chamber cleaning. COCl$_2$ (phosgene) is preferably provided in situ in etch or deposition reactors by reacting gaseous carbon monoxide and chlorine to form phosgene assisted by an external energy source (e.g. plasma) as follows:

$$CO(g) + Cl_2(g) \rightarrow COCl_2$$

In other embodiments of the present invention such as applications that are sensitive to boron residue, chlorocarbons (CC) and hydrochlorocarbons (HCC) may be employed as the reactive agent because these compounds may contain chlorine as well as oxygen getter components (C or H). The general formula for the CC and HCC compounds is $C_xH_yCl_z$, where x ranges from 1 to 6, y ranges from 0 to 13, and z ranges from 1 to 14. Examples of suitable CC and HCC compounds include, but are not limited to, trans-dichloroethylene $C_2H_2Cl_2$ (a.k.a. Trans-LC®), cis-dichloroethylele, 1,1-dichloroethylele, 1,1,1-trichloroethane ($C_2H_3Cl_3$), or tetrachloroethylene $C_2Cl_4$, $C_4H_4Cl_4$, CHCl$_3$, and CCl$_4$. Some CC and HCC compounds may react with high-k metal oxides without the addition of oxygen. For example, in some embodiments, tetrachloroethylene ($C_2Cl_4$) can react with Al$_2$O$_3$ to form volatile byproducts as follows:

$$1.5C_2Cl_4(g) + Al_2O_3 \rightarrow 2AlCl_3(g) + 3CO(g)$$

Table 8 illustrates that the reaction is thermodynamically favorable at temperatures above 100° C.

TABLE 8

Thermodynamic data for reaction: 1.5C$_2$Cl$_4$(g) + Al$_2$O$_3$ = 2AlCl$_3$(g) + 3CO(g)

| T (° C.) | ΔH (kcal) | ΔS (cal) | ΔG (kcal) | K$_{eq}$ |
|---|---|---|---|---|
| 0.000 | 46.723 | 157.382 | 3.734 | 1.028E−003 |
| 100.000 | 46.760 | 157.552 | −12.031 | 1.114E+007 |
| 200.000 | 46.314 | 156.508 | −27.738 | 6.509E+012 |
| 300.000 | 45.599 | 155.144 | −43.322 | 3.317E+016 |
| 400.000 | 44.704 | 153.709 | −58.765 | 1.204E+019 |
| 500.000 | 43.674 | 152.284 | −74.064 | 8.667E+020 |
| 600.000 | 42.541 | 150.907 | −89.223 | 2.160E+022 |
| 700.000 | 41.340 | 149.605 | −104.248 | 2.594E+023 |
| 800.000 | 40.087 | 148.380 | −119.147 | 1.848E+024 |
| 900.000 | 38.793 | 147.228 | −133.927 | 8.948E+024 |
| 1000.000 | 37.467 | 146.143 | −148.595 | 3.236E+025 |

The above thermochemical calculations are illustrations of limiting cases for those chemical reactions. In addition to the limiting case reaction products such as B$_2$O$_3$, intermediate reaction products such as boron oxychloride (BOCl) can also be formed in reactions between high-k materials and $BCl_3$. Intermediate reaction products such as BOCl may have higher volatility and thus may further enhance the removal of high-k materials.

Other CC and HCC compounds may need the addition of oxygen to release chlorine without forming carbon residues (soot). For example, trans-dichloroethylene ($C_2H_2Cl_2$) (a.k.a. Trans-LC®) can react with $Al_2O_3$ at an $O_2$:$C_2H_2Cl_2$ molar ratio of 2:1:

$$6O_2(g)+Al_2O_3+3C_2H_2Cl_2(g)=2AlCl_3(g)+6CO_2(g)+3H_2O(g)$$

Table 9 shows such a reaction is thermodynamically favorable at temperatures between 0 and 1000° C.

TABLE 9

Thermodynamic data for reaction:
$6O_2(g) + Al_2O_3 + 3C_2H_2Cl_2(g) = 2AlCl_3(g) + 6CO_2(g) + 3H_2O(g)$

| T (° C.) | ΔH (kcal) | ΔS (kcal) | ΔG (kcal) | $K_{eq}$ |
|---|---|---|---|---|
| 0.000 | −616.464 | 77.981 | −637.764 | 1.000E+308 |
| 100.000 | −616.428 | 78.113 | −645.576 | 1.000E+308 |
| 200.000 | −616.656 | 77.585 | −653.365 | 6.559E+301 |
| 300.000 | −617.145 | 76.654 | −661.079 | 1.257E+252 |
| 400.000 | −617.872 | 75.490 | −668.688 | 1.316E+217 |
| 500.000 | −618.811 | 74.193 | −676.173 | 1.422E+191 |
| 600.000 | −619.918 | 72.848 | −683.525 | 1.261E+171 |
| 700.000 | −621.140 | 71.523 | −690.743 | 1.380E+155 |
| 800.000 | −622.440 | 70.253 | −697.832 | 1.340E+142 |
| 900.000 | −623.784 | 69.056 | −704.796 | 2.040E+131 |
| 1000.000 | −625.138 | 67.947 | −711.646 | 1.485E+122 |

An excess amount of oxygen is undesirable in the above reactions since excess $O_2$ can convert metal chlorides back to metal oxides. A better way to prevent excess oxygen is to oxidize carbon only partially into CO by running the reaction under an oxygen lean condition. For example, $O_2$:$C_2H_2Cl_2$ molar ratio of 1:1 can lead to the formation of CO and $AlCl_3$ as the byproducts:

$$3C_2H_2Cl_2(g)+Al_2O_3+3O_2=2AlCl_3(g)+6CO(g)+3H_2O(g)$$

As shown in Table 10, such partial oxidation reaction is also favorable thermodynamically.

TABLE 10

Thermodynamic data for reaction:
$3C_2H_2Cl_2(g) + Al_2O_3 + 3O_2 = 2AlCl_3(g) + 6CO(g) + 3H_2O(g)$

| T (° C.) | ΔH (kcal) | ΔS (kcal) | ΔG (kcal) | $K_{eq}$ |
|---|---|---|---|---|
| 0.000 | −210.973 | 200.961 | −265.865 | 5.480E+212 |
| 100.000 | −210.103 | 203.760 | −286.136 | 3.984E+167 |
| 200.000 | −210.055 | 203.905 | −306.532 | 3.982E+141 |
| 300.000 | −210.561 | 202.949 | −326.881 | 4.512E+124 |
| 400.000 | −211.485 | 201.470 | −347.105 | 5.046E+112 |
| 500.000 | −212.749 | 199.725 | −367.166 | 6.267E+103 |
| 600.000 | −214.276 | 197.870 | −387.046 | 7.688E+096 |
| 700.000 | −215.992 | 196.011 | −406.740 | 2.255E+091 |
| 800.000 | −217.847 | 194.197 | −426.250 | 6.518E+086 |
| 900.000 | −219.797 | 192.461 | −445.582 | 1.037E+083 |
| 1000.000 | −221.800 | 190.822 | −464.745 | 6.097E+079 |

Instead of oxygen, chlorine ($Cl_2$) can be added to prevent the formation of carbon soot. For example, $Cl_2$:$C_2H_2Cl_2$ molar ratio of 2:1 allows the following reaction:

$$2Cl_2(g)+Al_2O_3+C_2H_2Cl_2(g)=2AlCl_3(g)+H_2O(g)+2CO(g)$$

Similarly, $Cl_2$:$C_2H_2Cl_2$ molar ratio of 4:1 allows the following reaction:

$$4Cl_2(g)+Al_2O_3+C_2H_2Cl_2(g)=3.333AlCl_3(g)+H_2O(g)+2CO_2(g)$$

Both reactions are thermodynamically favorable, as shown in Tables 11 and 12. The use of chlorine to control soot formation is more desirable since excess amount of chlorine helps the chlorination of metal oxides.

TABLE 11

Thermodynamic data for reaction:
$2Cl_2(g) + Al_2O_3 + C_2H_2Cl_2(g) = 2AlCl_3(g) + H_2O(g) + 2CO(g)$

| T (° C.) | ΔH (kcal) | ΔS (kcal) | ΔG (kcal) | $K_{eq}$ |
|---|---|---|---|---|
| 0.000 | 10.291 | 101.403 | −17.407 | 8.479E+013 |
| 100.000 | 10.619 | 102.465 | −27.616 | 1.498E+016 |
| 200.000 | 10.554 | 102.326 | −37.861 | 3.088E+017 |
| 300.000 | 10.225 | 101.701 | −48.065 | 2.135E+018 |
| 400.000 | 9.697 | 100.855 | −58.194 | 7.859E+018 |
| 500.000 | 9.005 | 99.900 | −68.233 | 1.946E+019 |
| 600.000 | 8.185 | 98.904 | −78.173 | 3.701E+019 |
| 700.000 | 7.277 | 97.920 | −88.014 | 5.858E+019 |
| 800.000 | 6.303 | 96.967 | −97.758 | 8.134E+019 |
| 900.000 | 5.280 | 96.056 | −107.409 | 1.026E+020 |
| 1000.000 | 4.224 | 95.193 | −116.971 | 1.205E+020 |

TABLE 12

Thermodynamic data for reaction:
$4Cl_2(g) + Al_2O_3 + C_2H_2Cl_2(g) = 3.333AlCl_3(g) + H_2O(g) + 2CO_2(g)$

| T (° C.) | ΔH (kcal) | ΔS (kcal) | ΔG (kcal) | $K_{eq}$ |
|---|---|---|---|---|
| 0.000 | −44.076 | 94.797 | −69.970 | 9.734E+055 |
| 100.000 | −43.990 | 95.096 | −79.475 | 3.562E+046 |
| 200.000 | −44.229 | 94.542 | −88.962 | 1.245E+041 |
| 300.000 | −44.715 | 93.617 | −98.372 | 3.262E+037 |
| 400.000 | −45.399 | 92.520 | −107.680 | 9.182E+034 |
| 500.000 | −46.255 | 91.338 | −116.873 | 1.096E+033 |
| 600.000 | −47.248 | 90.132 | −125.946 | 3.365E+031 |
| 700.000 | −48.328 | 88.961 | −134.900 | 1.988E+030 |
| 800.000 | −49.475 | 87.840 | −143.740 | 1.886E+029 |
| 900.000 | −50.671 | 86.775 | −152.470 | 2.550E+028 |
| 1000.000 | −51.901 | 85.769 | −161.097 | 4.532E+027 |

In addition to the chloride compounds, the bromide and iodide compounds of these high-k materials, such as $AlBr_3$, $AlI_3$, $HfBr_4$, $HfI_4$, $ZrBr_4$, and $ZrI_4$ have volatility similar to their corresponding chlorides. Therefore, some bromo- and iodo-compounds can also be used to etch/clean these high-k materials. Bromine and iodine ions are heavier than chlorine ions, hence bromine and iodine ions can provide more effective sputtering to energize plasma-assisted etch/clean reactions with high-k materials. Bromine and iodine atoms have higher surface sticking coefficients than chlorine atoms. A higher sticking coefficient relates to a higher probability for bromine and iodine atoms/ions to be adsorbed onto the surface of high-k materials hence enhancing the bromination/iodization reactions. Desirable bromo- and iodo-compounds may contain an oxygen-getter function in the molecule. Examples of suitable bromine and iodine containing compounds include boron tribromide ($BBr_3$), boron triiodide ($BI_3$), hydrogen bromide (HBr), hydro iodide (HI), bromocarbons such as $CBr_4$, bromohydrocarbons such as trans-dibromoethylene ($C_2H_2Br_2$), iodocarbons such as $CI_4$, and iodohydrocarbons such as trans-diiodoethylene ($C_2H_2I_2$) etc. For $HfO_2$, the bromine and iodine chemistries are dramatically more favorable than the corresponding chlorine chemistry, as shown in tables 13-15.

TABLE 13

Thermodynamic data for reaction:
$1.5HfO_2 + 2BCl_3(g) = 1.5HfCl_4(g) + B_2O_3$

| T (° C.) | ΔH (kcal) | ΔS (kcal) | ΔG (kcal) | $K_{eq}$ |
|---|---|---|---|---|
| 0.000 | −17.999 | −12.638 | −14.547 | 4.367E+011 |
| 100.000 | −18.096 | −12.924 | −13.273 | 5.950E+007 |
| 200.000 | −18.268 | −13.335 | −11.959 | 3.346E+005 |
| 300.000 | −18.413 | −13.614 | −10.611 | 1.113E+004 |
| 400.000 | −18.507 | −13.765 | −9.241 | 1.001E+003 |
| 500.000 | −12.540 | −5.525 | −8.268 | 2.175E+002 |
| 600.000 | −12.126 | −5.020 | −7.743 | 8.672E+001 |
| 700.000 | −11.790 | −4.655 | −7.260 | 4.271E+001 |
| 800.000 | −11.524 | −4.395 | −6.808 | 2.436E+001 |
| 900.000 | −11.321 | −4.213 | −6.378 | 1.543E+001 |
| 1000.000 | −11.176 | −4.094 | −5.963 | 1.056E+001 |

TABLE 14

Thermodynamic data for reaction:
$1.5HfO_2 + 2BBr_3(g) = 1.5HfBr_4(g) + B_2O_3$

| T (° C.) | ΔH (kcal) | ΔS (kcal) | ΔG (kcal) | $K_{eq}$ |
|---|---|---|---|---|
| 0.000 | −53.997 | −10.093 | −51.241 | 1.003E+041 |
| 100.000 | −54.122 | −10.459 | −50.219 | 2.602E+029 |
| 200.000 | −54.371 | −11.049 | −49.143 | 5.026E+022 |
| 300.000 | −54.601 | −11.492 | −48.014 | 2.042E+018 |
| 400.000 | −54.773 | −11.770 | −46.850 | 1.629E+015 |
| 500.000 | −48.872 | −3.621 | −46.073 | 1.058E+013 |
| 600.000 | −48.508 | −3.178 | −45.734 | 2.806E+011 |
| 700.000 | −48.207 | −2.851 | −45.433 | 1.600E+010 |
| 800.000 | −47.960 | −2.609 | −45.161 | 1.577E+009 |
| 900.000 | −47.761 | −2.431 | −44.909 | 2.328E+008 |
| 1000.000 | −47.606 | −2.304 | −44.673 | 4.669E+007 |

TABLE 15

Thermodynamic data for reaction:
$1.5HfO_2 + 2BI_3(g) = 1.5HfI_4(g) + B_2O_3$

| T (° C.) | ΔH (kcal) | ΔS (kcal) | ΔG (kcal) | $K_{eq}$ |
|---|---|---|---|---|
| 0.000 | −58.042 | −15.921 | −53.694 | 9.212E+042 |
| 100.000 | −58.342 | −16.842 | −52.057 | 3.104E+030 |
| 200.000 | −58.692 | −17.675 | −50.329 | 1.775E+023 |
| 300.000 | −58.991 | −18.250 | −48.531 | 3.214E+018 |
| 400.000 | −59.216 | −18.614 | −46.686 | 1.442E+015 |
| 500.000 | −53.362 | −10.530 | −45.221 | 6.080E+012 |
| 600.000 | −53.042 | −10.139 | −44.189 | 1.152E+011 |
| 700.000 | −52.784 | −9.859 | −43.190 | 5.015E+009 |
| 800.000 | −52.581 | −9.660 | −42.214 | 3.961E+008 |
| 900.000 | −52.429 | −9.524 | −41.256 | 4.856E+007 |
| 1000.000 | −52.324 | −9.438 | −40.308 | 8.315E+006 |

Similarly, bromine and iodine chemistries are also thermodynamically favorable for reactions with $Al_2O_3$ and $ZrO_2$, as shown in Tables 16-18.

TABLE 16

Thermodynamic data for reaction:
$2BBr_3(g) + Al_2O_3 = 2AlBr_3(g) + B_2O_3$

| T (° C.) | ΔH (kcal) | ΔS (kcal) | ΔG (kcal) | $K_{eq}$ |
|---|---|---|---|---|
| 0.000 | −2.212 | 12.687 | −5.678 | 3.493E+004 |
| 100.000 | −2.279 | 12.503 | −6.944 | 1.168E+004 |
| 200.000 | −2.482 | 12.022 | −8.170 | 5.945E+003 |
| 300.000 | −2.685 | 11.632 | −9.352 | 3.683E+003 |

TABLE 16-continued

Thermodynamic data for reaction:
$2BBr_3(g) + Al_2O_3 = 2AlBr_3(g) + B_2O_3$

| T (° C.) | ΔH (kcal) | ΔS (kcal) | ΔG (kcal) | $K_{eq}$ |
|---|---|---|---|---|
| 400.000 | −2.852 | 11.362 | −10.501 | 2.567E+003 |
| 500.000 | 3.023 | 19.476 | −12.035 | 2.525E+003 |
| 600.000 | 3.337 | 19.858 | −14.003 | 3.200E+003 |
| 700.000 | 3.579 | 20.122 | −16.003 | 3.928E+003 |
| 800.000 | 3.764 | 20.303 | −18.024 | 4.688E+003 |
| 900.000 | 3.897 | 20.422 | −20.061 | 5.464E+003 |
| 1000.000 | 3.985 | 20.494 | −22.107 | 6.241E+003 |

TABLE 17

Thermodynamic data for reaction:
$2BBr_3(g) + 1.5ZrO_2 = 1.5ZrBr_4(g) + B_2O_3$

| T (° C.) | ΔH (kcal) | ΔS (kcal) | ΔG (kcal) | $K_{eq}$ |
|---|---|---|---|---|
| 0.000 | −44.096 | −11.573 | −40.935 | 5.691E+032 |
| 100.000 | −44.194 | −11.861 | −39.768 | 1.965E+023 |
| 200.000 | −44.363 | −12.264 | −38.560 | 6.495E+017 |
| 300.000 | −44.489 | −12.509 | −37.320 | 1.706E+014 |
| 400.000 | −44.545 | −12.600 | −36.064 | 5.125E+011 |
| 500.000 | −38.522 | −4.282 | −35.212 | 9.000E+009 |
| 600.000 | −38.033 | −3.686 | −34.815 | 5.186E+008 |
| 700.000 | −37.604 | −3.220 | −34.470 | 5.520E+007 |
| 800.000 | −37.229 | −2.853 | −34.167 | 9.096E+006 |
| 900.000 | −36.902 | −2.561 | −33.897 | 2.067E+006 |
| 1000.000 | −36.619 | −2.330 | −33.653 | 5.989E+005 |

TABLE 18

Thermodynamic data for reaction:
$2BI_3(g) + 1.5ZrO_2 = 1.5ZrI_4(g) + B_2O_3$

| T (° C.) | ΔH (kcal) | ΔS (kcal) | ΔG (kcal) | $K_{eq}$ |
|---|---|---|---|---|
| 0.000 | −74.430 | −11.695 | −71.235 | 1.001E+057 |
| 100.000 | −74.587 | −12.171 | −70.045 | 1.067E+041 |
| 200.000 | −74.805 | −12.689 | −68.801 | 6.053E+031 |
| 300.000 | −74.972 | −13.013 | −67.514 | 5.573E+025 |
| 400.000 | −75.065 | −13.163 | −66.204 | 3.134E+021 |
| 500.000 | −69.074 | −4.891 | −65.293 | 2.873E+018 |
| 600.000 | −68.614 | −4.330 | −64.833 | 1.695E+016 |
| 700.000 | −68.212 | −3.894 | −64.423 | 2.947E+014 |
| 800.000 | −67.861 | −3.549 | −64.052 | 1.110E+013 |
| 900.000 | −67.555 | −3.276 | −63.711 | 7.411E+011 |
| 1000.000 | −67.291 | −3.061 | −63.394 | 7.642E+010 |

In certain embodiments, the reactive agent may comprise a chelating compound. A chelating compound, as used herein, describes a compound that contains at least two electron-rich (e.g., Lewis base) sites that could potentially interact with an electron-deficient (e.g., Lewis acid) metal atom such as, but not limited to, Zr, Al, or Hf. It is not required, however, that the plurality of sites simultaneously interact with the metal in order. Also, the chelating compound may be delivered into the reaction chamber as a conjugate acid of the basic site. Examples of these compounds may be found in U.S. Pat. No. 3,634,477. Further examples of chelating compounds include oxy-halocarbon compounds, such as chloroacetic acid, oxalyl chloride, etc., are known to be chelating compounds or agents that can react with metal oxides and metal chlorides to form volatile byproducts. Some exemplary chelating compounds may have the formula $C_\alpha H_\beta X_\gamma Y_\delta O_\epsilon$, wherein X and Y are one of the halogen atoms F, Cl, Br, and I; α is a number ranging from 1 to 6, β is a number ranging from 0 to 13, the sum of γ+δ is a number ranging from 1 to 14, and ε is a number ranging from 1 to 6. Examples of these compounds include hexafluoropetanedione (CCl$_3$C(O)CH$_2$C(O)CCl$_3$) (a.k.a. Hhfac), hexachloropetanedione (CCl$_3$C(O)CH$_2$C(O)CCl$_3$), hexafluoroacetone (CF$_3$C(O)CF$_3$) and hexachloroacetone (CCl$_3$C(O)CCl$_3$). For example, hexafluoropetanedione (a.k.a. Hhfac) (CF$_3$C(O)CH$_2$C(O)CF$_3$, or C$_5$H$_2$O$_2$F$_6$) is a common chelating agent that can react with a wide variety of metal oxides and/or chlorides to form volatile organometal compounds M(hfac)$_x$, where M is a metal ion such as Al$^{3+}$, Hf$^{4+}$, and Zr$^{4+}$ etc. Such chelating property can be used to enhance the etching and chamber cleaning of high-k materials. In addition, these molecules can be used as an oxygen scavenger to enhance chlorination of the high-k materials. For example, one can have:

HfO$_2$+C$_5$H$_2$O$_2$F$_6$+2Cl$_2$+O$_2$=HfCl$_4$(g)+H$_2$O(g)+ 3COF$_2$(g)+2CO(g)

In certain embodiments of the present invention, the chlorine analog of Hhfac, hexachloropetanedione (CCl$_3$C(O)CH$_2$C(O)CCl$_3$) may be more advantageous as the reactive agent since it can be both an oxygen scavenger and a chlorinating agent. These reactions can be also be assisted by thermal and/or plasma activation. For example, C$_5$H$_2$O$_2$Cl$_6$+Al$_2$O$_3$+0.5O$_2$=2AlCl$_3$(g)+5CO(g)+H$_2$O (g)

and

2C$_5$H$_2$O$_2$Cl$_6$+3HfO$_2$+O$_2$=3HfCl$_4$(g)+10CO(g)+2H$_2$O (g)

To prevent oxidation of the metal chlorides, chlorine can be used to replace oxygen:

C$_5$H$_2$O$_2$Cl$_6$+Al$_2$O$_3$+Cl$_2$=2AlCl$_3$(g)+5CO(g)+2HCl(g)

In certain embodiments, chlorosilanes, hydrochlorosilanes, and organochlorosilanes can also be effective agents to etch/clean high-k materials. Due in part to the highly stable SiO$_2$ byproduct, these compounds may be both a very effective oxygen scavenger and a chlorinating agent. Upon exposure to a thermal or plasma source, these compounds may be just as effective as BCl$_3$ to convert high-k materials into volatile chlorides without the potential problem of boron residue contamination. In certain embodiments, the chlorosilane, hydrochlorosilane, or organochlorosilane compound has the formula Si$_p$Cl$_q$R$_s$H$_t$, wherein: 1≦p≦3, 1≦q≦{2p+2−(s+t)}, s and t can have any values subject to the constraint that 0≦(s+t)≦(2p+1) and R is an organic radical having 1-8 carbon atoms, including: hydrocarbyl (e.g. methyl, ethyl, phenyl, p-tolyl), halocarbyl (e.g., trichloromethyl, trifluoromethyl, pentafluoroethyl), halogenated hydrocarbyl (e.g., chloromethyl, 2,4-difluorophenyl), oxygenated hydrocarbyl (e.g., methoxy, hydroxyethyl, chlorormethoxy) and nitrogen-substituted hydrocarbyl moieties (e.g., aminomethyl, dimethylaminonomethyl, pyridyl). Exemplary reactions include:

1.5SiCl$_4$(g)+Al$_2$O$_3$=2AlCl$_3$(g)+1.5SiO$_2$

SiCl$_4$(g)+HfO$_2$=HfCl$_4$(g)+SiO$_2$

SiCl$_4$(g)+ZrO$_2$=ZrCl$_4$(g)+SiO$_2$

O$_2$(g)+2SiHCl$_3$(g)+Al$_2$O$_3$=2AlCl$_3$(g)+H$_2$O(g)+2SiO$_2$

4O$_2$(g)+2SiCH$_3$Cl$_3$(g)+Al$_2$O$_3$=2AlCl$_3$(g)+3H$_2$O(g)+ 2SiO$_2$+2CO$_2$(g)

Thermodynamic calculations show that the above reactions are favorable at room temperature or moderately elevated temperatures, as shown in Tables 19-23.

TABLE 19

Thermodynamic data for reaction:
1.5SiCl$_4$(g) + Al$_2$O$_3$ = 2AlCl$_3$(g) + 1.5SiO$_2$

| T (° C.) | ΔH (kcal) | ΔS (kcal) | ΔG (kcal) | K$_{eq}$ |
|---|---|---|---|---|
| 0.000 | 32.037 | 34.471 | 22.621 | 7.927E−019 |
| 100.000 | 31.880 | 33.990 | 19.196 | 5.703E−012 |
| 200.000 | 31.647 | 33.439 | 15.825 | 4.895E−008 |
| 300.000 | 31.400 | 32.967 | 12.506 | 1.702E−005 |
| 400.000 | 31.178 | 32.608 | 9.228 | 1.009E−003 |
| 500.000 | 31.009 | 32.373 | 5.980 | 2.039E−002 |
| 600.000 | 31.097 | 32.475 | 2.742 | 2.059E−001 |
| 700.000 | 30.702 | 32.047 | −0.484 | 1.285E+000 |
| 800.000 | 30.291 | 31.645 | −3.669 | 5.587E+000 |
| 900.000 | 30.612 | 31.957 | −6.878 | 1.912E+001 |
| 1000.000 | 30.204 | 31.623 | −10.057 | 5.327E+001 |

TABLE 20

Thermodynamic data for reaction:
SiCl$_4$(g) + HfO$_2$ = HfCl$_4$(g) + SiO$_2$

| T (° C.) | ΔH (kcal) | ΔS (kcal) | ΔG (kcal) | K$_{eq}$ |
|---|---|---|---|---|
| 0.000 | 2.985 | 6.373 | 1.244 | 1.010E−001 |
| 100.000 | 2.825 | 5.878 | 0.631 | 4.267E−001 |
| 200.000 | 2.636 | 5.430 | 0.067 | 9.314E−001 |
| 300.000 | 2.459 | 5.089 | −0.458 | 1.495E+000 |
| 400.000 | 2.317 | 4.860 | −0.955 | 2.042E+000 |
| 500.000 | 2.230 | 4.739 | −1.434 | 2.543E+000 |
| 600.000 | 2.330 | 4.857 | −1.911 | 3.009E+000 |
| 700.000 | 2.110 | 4.618 | −2.385 | 3.432E+000 |
| 800.000 | 1.877 | 4.391 | −2.835 | 3.779E+000 |
| 900.000 | 2.130 | 4.633 | −3.306 | 4.129E+000 |
| 1000.000 | 1.892 | 4.439 | −3.759 | 4.419E+000 |

TABLE 21

Thermodynamic data for reaction:
SiCl$_4$(g) + ZrO$_2$ = ZrCl$_4$(g) + SiO$_2$

| T (° C.) | ΔH (kcal) | ΔS (kcal) | ΔG (kcal) | K$_{eq}$ |
|---|---|---|---|---|
| 0.000 | −4.912 | 6.726 | −6.749 | 2.516E+005 |
| 100.000 | −5.006 | 6.439 | −7.408 | 2.185E+004 |
| 200.000 | −5.123 | 6.160 | −8.038 | 5.164E+003 |
| 300.000 | −5.226 | 5.963 | −8.643 | 1.977E+003 |
| 400.000 | −5.288 | 5.861 | −9.233 | 9.955E+002 |
| 500.000 | −5.292 | 5.854 | −9.818 | 5.966E+002 |
| 600.000 | −5.106 | 6.077 | −10.412 | 4.041E+002 |
| 700.000 | −5.237 | 5.936 | −11.013 | 2.975E+002 |
| 800.000 | −5.375 | 5.800 | −11.600 | 2.304E+002 |
| 900.000 | −5.026 | 6.129 | −12.216 | 1.887E+002 |
| 1000.000 | −5.163 | 6.016 | −12.823 | 1.590E+002 |

TABLE 22

Thermodynamic data for reaction:
O$_2$(g) + 2SiHCl$_3$(g) + Al$_2$O$_3$ = 2AlCl$_3$(g) + H$_2$O(g) + 2SiO$_2$

| T (° C.) | ΔH (kcal) | ΔS (kcal) | ΔG (kcal) | K$_{eq}$ |
|---|---|---|---|---|
| 0.000 | −134.894 | 4.620 | −136.156 | 8.893E+108 |
| 100.000 | −135.412 | 2.993 | −136.529 | 9.339E+079 |
| 200.000 | −135.834 | 1.989 | −136.775 | 1.521E+063 |
| 300.000 | −136.187 | 1.309 | −136.938 | 1.662E+052 |
| 400.000 | −136.464 | 0.863 | −137.045 | 3.145E+044 |
| 500.000 | −136.643 | 0.612 | −137.117 | 5.789E+038 |

TABLE 22-continued

Thermodynamic data for reaction:
$O_2(g) + 2SiHCl_3(g) + Al_2O_3 = 2AlCl_3(g) + H_2O(g) + 2SiO_2$

| T (° C.) | ΔH (kcal) | ΔS (kcal) | ΔG (kcal) | $K_{eq}$ |
|---|---|---|---|---|
| 600.000 | −136.462 | 0.826 | −137.183 | 2.187E+034 |
| 700.000 | −136.917 | 0.333 | −137.241 | 6.669E+030 |
| 800.000 | −137.387 | −0.126 | −137.251 | 8.991E+027 |
| 900.000 | −136.875 | 0.364 | −137.301 | 3.806E+025 |
| 1000.000 | −137.329 | −0.008 | −137.319 | 3.752E+023 |

TABLE 23

Thermodynamic data for reaction:
$4O_2(g) + 2SiCH_3Cl_3(g) + Al_2O_3 = 2AlCl_3(g) + 3H_2O(g) + 2SiO_2 + 2CO_2(g)$

| T (° C.) | ΔH (kcal) | ΔS (kcal) | ΔG (kcal) | $K_{eq}$ |
|---|---|---|---|---|
| 0.000 | −423.175 | 31.434 | −431.762 | 1.000E+308 |
| 100.000 | −423.093 | 31.710 | −434.925 | 5.650E+254 |
| 200.000 | −423.197 | 31.470 | −438.087 | 2.349E+202 |
| 300.000 | −423.424 | 31.038 | −441.213 | 1.797E+168 |
| 400.000 | −423.714 | 30.573 | −444.294 | 1.818E+144 |
| 500.000 | −424.016 | 30.154 | −447.329 | 2.878E+126 |
| 600.000 | −424.028 | 30.132 | −450.339 | 5.361E+112 |
| 700.000 | −424.723 | 29.380 | −453.314 | 6.510E+101 |
| 800.000 | −425.461 | 28.658 | −456.216 | 8.264E+092 |
| 900.000 | −425.237 | 28.892 | −459.132 | 3.469E+085 |
| 1000.000 | −425.990 | 28.276 | −461.990 | 2.051E+079 |

In addition, other chloride compounds such as $GeCl_4$ and related compounds can also be used to etch/clean high-k materials in a similar manner. When etching/cleaning hafnium and zirconium based high-k materials, $AlCl_3$ can be added into the reactants to enhance the chlorination of $HfO_2$, $ZrO_2$, $HfSi_xO_y$, and $ZrSi_xO_y$ etc. This is because $AlCl_3$ can be used as an oxygen scavenger to facilitate the chlorination of $HfO_2$ and $ZrO_2$ etc. while forming aluminum oxychloride such as AlOCl, which is more volatile than $Al_2O_3$.

In addition to being thermodynamically favorable, a chemical reaction often requires an external energy source to overcome an activation energy barrier so that the reaction can proceed. The external energy source can be, for example, thermal heating or plasma activation. Higher temperatures can accelerate chemical reactions and make reaction byproducts more volatile. However, there may be practical limitations on temperature in production deposition chambers. Plasmas can generate more reactive species to facilitate reactions. Ions in the plasmas are accelerated by the electric field in the plasma sheath to gain energy. Energetic ions impinging upon surfaces can provide the energy needed to overcome reaction activation energy barrier. Ion bombardments also helps to volatize and remove reaction byproducts. These are common mechanisms in plasma etching/cleaning and reactive ion etching. Optionally, one can combine both thermal and plasma activation mechanisms to enhance the desired reactions for dry etching/cleaning of high-k materials. As an alternative to in situ plasma cleaning, one can use remote plasma source to generate more reactive species for cleaning high-k material residues from the deposition chambers. In addition, reactions between remote plasma generated reactive species and high-k materials can be activated and/or enhanced by heating CVD or ALD reactor components to elevated temperatures up to 600° C., or to 400° C., and or up to 300° C.

Figure 1B:
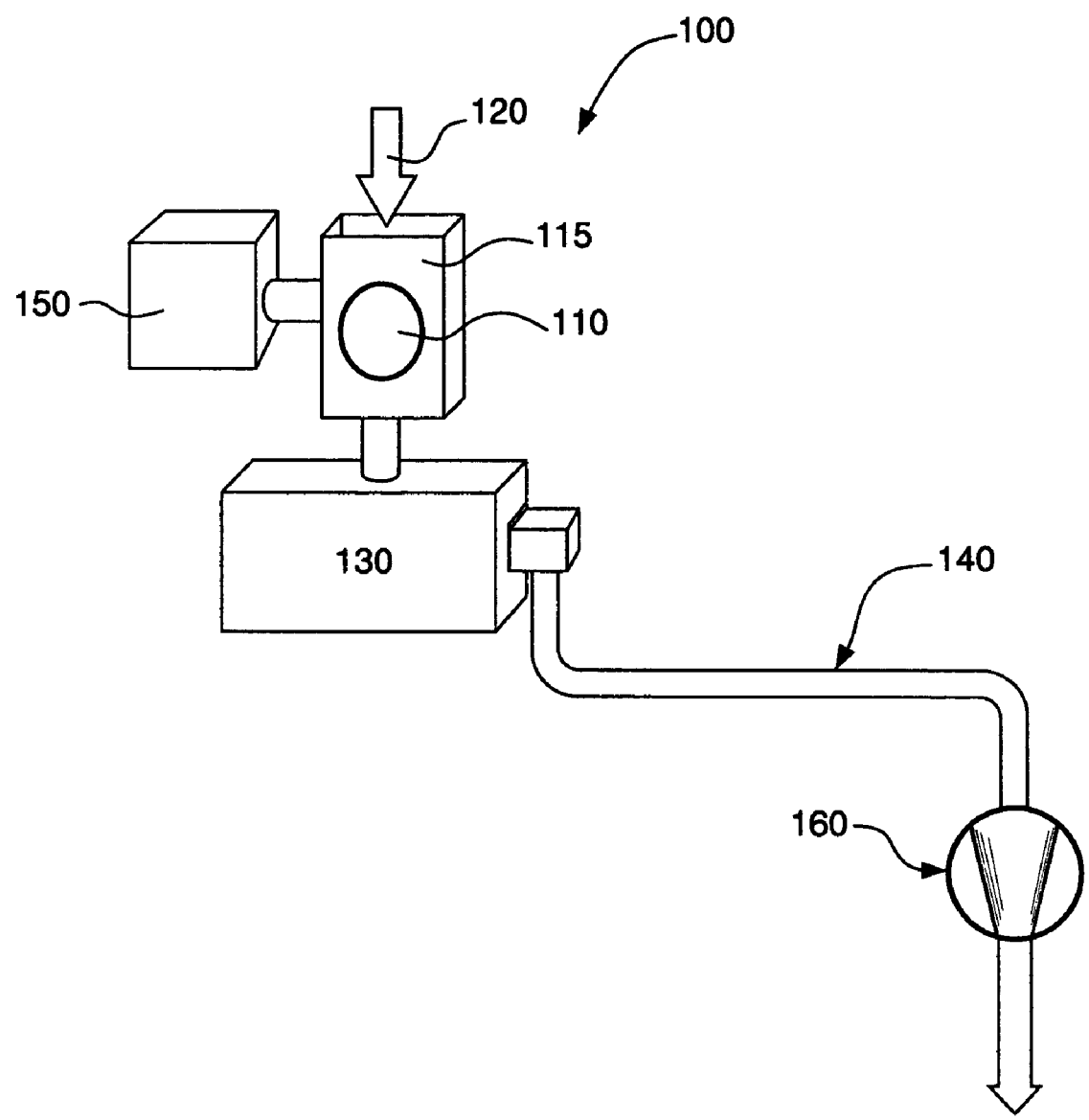

FIGS. 1a and 1b provides an illustration of an apparatus 10 suitable for performing chamber cleaning using an internal energy source such as an in-situ plasma or a thermal source or an external energy source, respectively. In FIG. 1a, the reactive agent 20 (i.e., $BCl_3$) (depicted in FIG. 1a as solid arrows) is introduced into the substrate 30 (i.e., reaction chamber), which has the substance 40 to be removed, or the high-k residues such as the $HfO_2$ depicted. As shown in FIG. 1a, the substance 40 is deposited upon at least a portion of the exposed surface within the reaction chamber 30, particularly, the grounded sidewalls 32, showerhead 34, work piece platform 36, etc. The reactive agent 20 is exposed to an external energy source 50, such as the RF power supply or heater shown, which creates active species 60 such as $BCl_3$ and Cl shown by the dashed arrows. The active species 60 react with substance 40 and form a volatile product 70 such as $HfCl_4$. The volatile product 70 is removed from the chamber 30 as shown by the dotted arrows.

FIG. 1b provides an example of an apparatus 100 wherein the reactive agent 120 (i.e., $BCl_3$) is exposed to an external energy source 150 such as a microwave source to produce a high density plasma 110 of the reactive agent within an applicator/resonant cavity 115. The high density plasma 110 can then be transported to the substrate 130 (i.e., reaction chamber) having the substance to be removed (not shown) and form the volatile product (not shown). The volatile product can be easily removed from the chamber 130 via the foreline shown 140 and assisted by pump 160.

EXAMPLES

The invention will be illustrated in more detail with reference to the following Examples, but it should be understood that the present invention is not deemed to be limited thereto.

The following are experimental examples of utilizing the above chemistries for dry etching/cleaning of high-k materials. The experiments for examples 1 through 3 were conducted in a parallel plate capacitively coupled RF plasma reactor similar to the setup illustrated in FIG. 2. Sample coupons 200 were prepared from wafers coated with high-k dielectric materials $Al_2O_3$, $HfO_2$, and $ZrO_2$ deposited by atomic layer deposition. For each experimental run, a sample coupon 200 was put onto a carrier wafer 210 and loaded onto the reactor chuck 220 through a loadlock 230. Process gases 240 were fed into the reactor 250 from a top mounted showerhead 255. The chuck 220 was then powered by a 13.56 MHz RF power source 260 to generate the plasma (not shown). Reactor 250 is connected to a turbo pump (not shown) through line 270. The thickness of the high-k film on a coupon was measured by ellipsometry both before and after a timed exposure of the processing plasma. Change in high-k film thickness after plasma processing is used to calculate the etch rate. In addition to etch rate, plasma dc self bias voltage ($V_{bias}$) was also measured. In examples 1-3, both the wafer and the chamber walls were kept at room temperature.

Example 1

Plasma Etching/Cleaning of $Al_2O_3$ Samples

Since power is one of the key processing parameters in plasma etching/cleaning, we evaluated power dependence of $Al_2O_3$ etching by $BCl_3$ plasma. The results are listed in Table 24 below.

TABLE 24

RF power dependence of $Al_2O_3$ etching by $BCl_3$ plasma

| Power (W) | Power density (W/cm$^2$) | Pressure (mTorr) | $Al_2O_3$ etch rate (nm/min) | $V_{bias}$ (V) |
|---|---|---|---|---|
| 50 | 0.27 | 500 | 0.0 | 16 |
| 100 | 0.55 | 500 | 3.0 | 35 |
| 200 | 1.10 | 500 | 9.8 | 58 |

Apparently there is a threshold power density of 0.55 W/cm$^2$ or threshold $V_{bias}$ of 35 V for etching $Al_2O_3$. Higher power density and higher $V_{bias}$ resulted in higher etch rate.

Next, we investigated chamber pressure dependence of $Al_2O_3$ etching by $BCl_3$ plasma. The results are listed in Table 25 below.

TABLE 25

Chamber pressure dependence of $Al_2O_3$ etching by $BCl_3$ plasma

| Power (W) | Power density (W/cm$^2$) | Pressure (mTorr) | $Al_2O_3$ etch rate (nm/min) | $V_{bias}$ (V) |
|---|---|---|---|---|
| 100 | 0.55 | 50 | 7.2 | 91 |
| 100 | 0.55 | 500 | 3.0 | 35 |
| 100 | 0.55 | 1000 | 0.8 | 4 |

A higher etch rate was achieved at a reduced pressure. There are two factors that favor the etch reactions at reduced pressure. First, higher bias voltage at lower pressure leads to more energetic ion bombardment to help the etch reactions to overcome activation energy barrier. Second, lower pressure leads to faster desorption and diffusion of reaction byproducts. Higher $V_{bias}$ also enhances physical sputtering by energetic ions. To delineate the contributions from reactive ion etching and physical sputtering, we conducted comparison runs using pure argon plasma. The results are listed in Table 26 below.

TABLE 26

Argon plasma etching of $Al_2O_3$

| Power (W) | Power density (W/cm$^2$) | Pressure (mTorr) | $Al_2O_3$ etch rate (nm/min) | $V_{bias}$ (V) |
|---|---|---|---|---|
| 200 | 1.10 | 5 | 0.6 | 173 |
| 200 | 1.10 | 50 | 1.0 | 189 |
| 200 | 1.10 | 500 | −0.4 | 185 |

The data showed pure argon plasma essentially did not etch $Al_2O_3$ even with very high power and a relatively higher $V_{bias}$ than that of $BCl_3$ plasmas. This indicates that physical sputtering may not be the primary mechanism to etch $Al_2O_3$. Instead, ion bombardment enhanced chemical etching, or reactive ion etching (RIE) may be the primary mechanism.

At a fixed RF excitation frequency (such as 13.56 MHz), the data in Tables 24 and 25 show, for example, that higher power and lower pressure can increase bias voltage, which in turn may enhance chemical etching of high-k materials. Lower pressure and higher power is particularly effective to enhance plasma etching of substrates coated with high-k films.

One can also operate the RF plasma at lower frequencies. Ions transiting through a plasma sheath often exhibit a bi-modal energy distribution at lower frequencies. Bimodal ion energy distribution results in a large fraction of the ions impinging onto reactor surfaces with higher energies. This can be an effective strategy to enhance plasma cleaning of high-k deposition residues from grounded ALD chamber surfaces.

Example 2

Plasma Etching/Cleaning of $HfO_2$ Samples

At 500 mTorr pressure, etching of $HfO_2$ was achieved at all power levels between 50 and 200 W. The results are listed in Table 27 below.

TABLE 27

$BCl_3$ plasma etching of $HfO_2$

| Power (W) | Power density (W/cm$^2$) | Pressure (mTorr) | $HfO_2$ etch rate (nm/min) | $V_{bias}$ (V) |
|---|---|---|---|---|
| 50 | 0.27 | 500 | 1.6 | 14 |
| 50 | 0.27 | 500 | 1.4 | 16 |
| 100 | 0.55 | 500 | 4.7 | 34 |
| 200 | 1.10 | 500 | 14.7 | 63 |

Example 3

Plasma Etching/Cleaning of $ZrO_2$ Samples

Several experiments were conducted with $ZrO_2$ samples using 500 mTorr pressure and various power levels between 50 and 200 W. The results are listed in Table 28 below.

TABLE 28

$BCl_3$ plasma etching of $ZrO_2$

| Power (W) | Power density (W/cm$^2$) | Pressure (mTorr) | $ZrO_2$ etch rate (nm/min) | $V_{bias}$ (V) |
|---|---|---|---|---|
| 50 | 0.27 | 500 | 0.3 | 16 |
| 100 | 0.55 | 500 | −3.8* | 32 |
| 100 | 0.55 | 500 | −2.5* | 45 |
| 200 | 1.10 | 500 | 7.1 | 65 |

*The film became thicker after one minute exposure to the plasma.

FIG. 3 shows the relative comparison of $BCl_3$ plasma etch rates of high-k materials $HfO_2$, $Al_2O_3$, and $ZrO_2$ at 500 mTorr chamber pressure and 1 W/cm$^2$ RF power density. It can be seen that $HfO_2$ has the highest etch rate, and $ZrO_2$ has the lowest etch rate among the three high-k materials.

Figure 4:
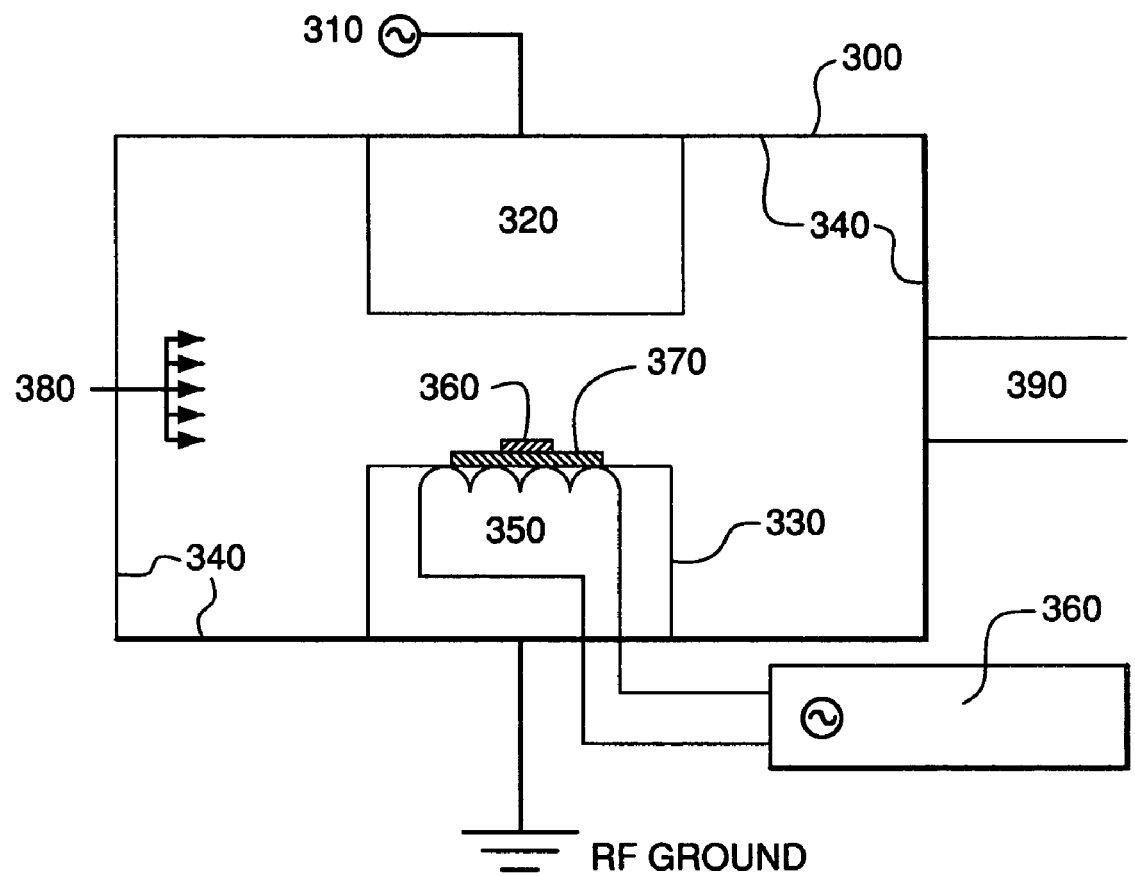
FIG. 4 provides an illustration of an apparatus for performing a process of the invention using thermal heating as the energy source FIG. 5 provides an illustration of the etch rate dependence on lower electrode/pedestal set temperature at constant chamber pressure and $BCl_3$ flow rate.

Examples 4 and 5 illustrate $BCl_3$ thermal etching/cleaning of high-k materials. FIG. 4 is a schematic of the experimental setup for examples 4 and 5. In this reactor chamber 300, RF power 310 can be applied on the top electrode 320, and the lower electrode 330 and the chamber walls 340 are grounded. This reactor can be operated with both RF plasma and thermal heating during an etching/cleaning experiments. Only thermal heating was used in examples 4 and 5. The lower electrode/pedestal 330 can be heated by an AC powered heater 350 and controlled by the temperature controller 360. The temperature range of the lower electrode/pedestal 330 is from room temperature up to 700° C. The sample 360 and the carrier wafer 370 were placed on the lower electrode/pedestal 330. Sample surface temperature is about 50° C. lower than the lower electrode set point in ambient atmosphere. Sample preparation and measurement procedures were similar to those in examples 1 through 3. After sample introduction, the reactor was evacuated, and the heater 350 was turned on. When the lower electrode 330 reached the set point, process gases 380 were introduced into the chamber 300 to reach a set pressure. The sample was exposed to the process gases 380 for a set period of time. The process gases 380 were evacuated through line 390 that connects to a pump (not shown) and the sample 360 was retrieved from the reactor chamber 300 for measurement.

Example 4

Thermal Etching/Cleaning of $Al_2O_3$ Samples

Several experiments were conducted using $BCl_3$ as the etchant for thermal etching/cleaning of $Al_2O_3$ samples. The process variables were lower electrode temperature, chamber pressure, and $BCl_3$ flow rate. The results are listed in Table 29.

TABLE 29

$BCl_3$ thermal etching of $Al_2O_3$

| Lower Electrode Set Temperature (° C.) | Chamber Pressure (Torr) | $BCl_3$ Flow Rate (sccm) | Etch Rate (nm/min) |
|---|---|---|---|
| 200 | 100 | 100 | 0.0 |
| 350 | 25 | 100 | 0.1 |
| 350 | 100 | 100 | 0.2 |
| 350 | 100 | 100 | 0.2 |
| 350 | 100 | 0 | 0.3 |
| 350 | 200 | 100 | 0.3 |
| 350 | 400 | 100 | 0.7 |
| 600 | 100 | 100 | 0.6 |

Example 5

Thermal Etching/Cleaning of $HfO_2$ Samples

A similar set of experiments were conducted using $BCl_3$ as the etchant for thermal etching/cleaning of $HfO_2$ samples. The process variables were lower electrode temperature, chamber pressure, and $BCl_3$ flow rate. The results are listed in Table 30.

TABLE 30

$BCl_3$ thermal etching of $HfO_2$

| Lower Electrode Set Temperature (° C.) | Chamber Pressure (Torr) | $BCl_3$ Flow Rate (sccm) | Etch Rate (nm/min) |
|---|---|---|---|
| 200 | 100 | 100 | 0.0 |
| 350 | 25 | 100 | 0.1 |
| 350 | 100 | 100 | 0.6 |
| 350 | 100 | 100 | 0.6 |
| 350 | 100 | 0 | 0.6 |
| 350 | 200 | 100 | 1.1 |
| 350 | 400 | 100 | 2.4 |
| 600 | 100 | 100 | 1.1 |

Figure 5:
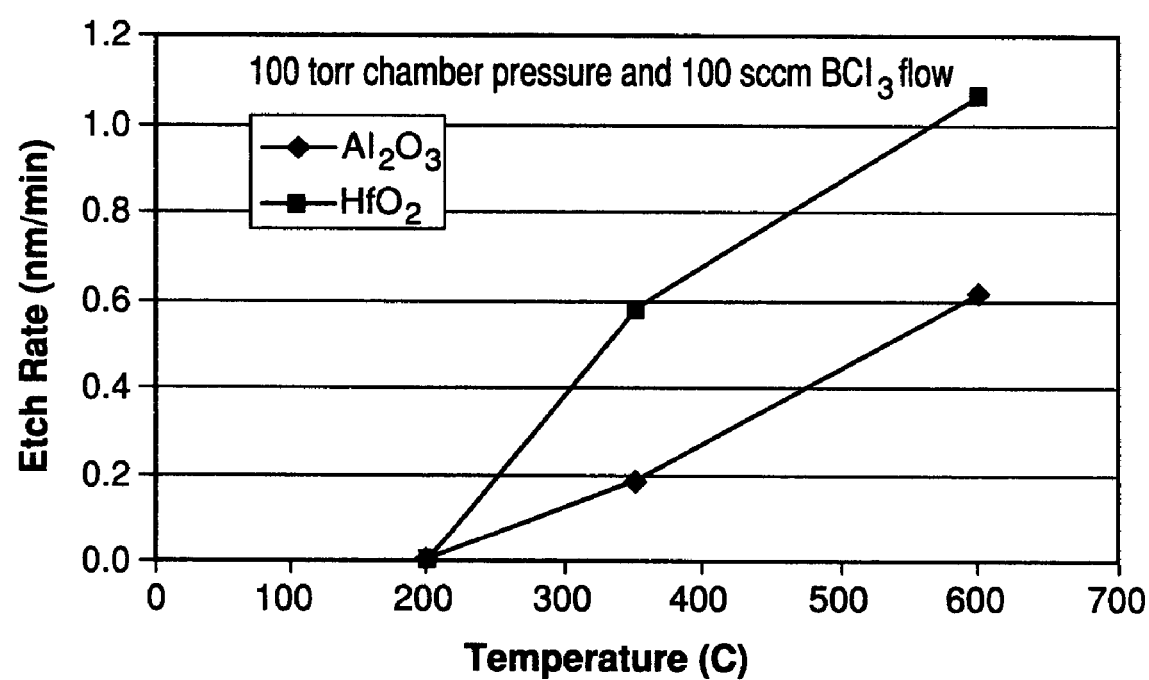

FIG. 5 examines the etch rate dependence on lower electrode temperature at constant chamber pressure and $BCl_3$ flow rate. It can be seen that both $Al_2O_3$ and $HfO_2$ etch rates increase at temperature increases. The etch rates of $HfO_2$ are higher than those of $Al_2O_3$ under the same conditions.

Figure 6:
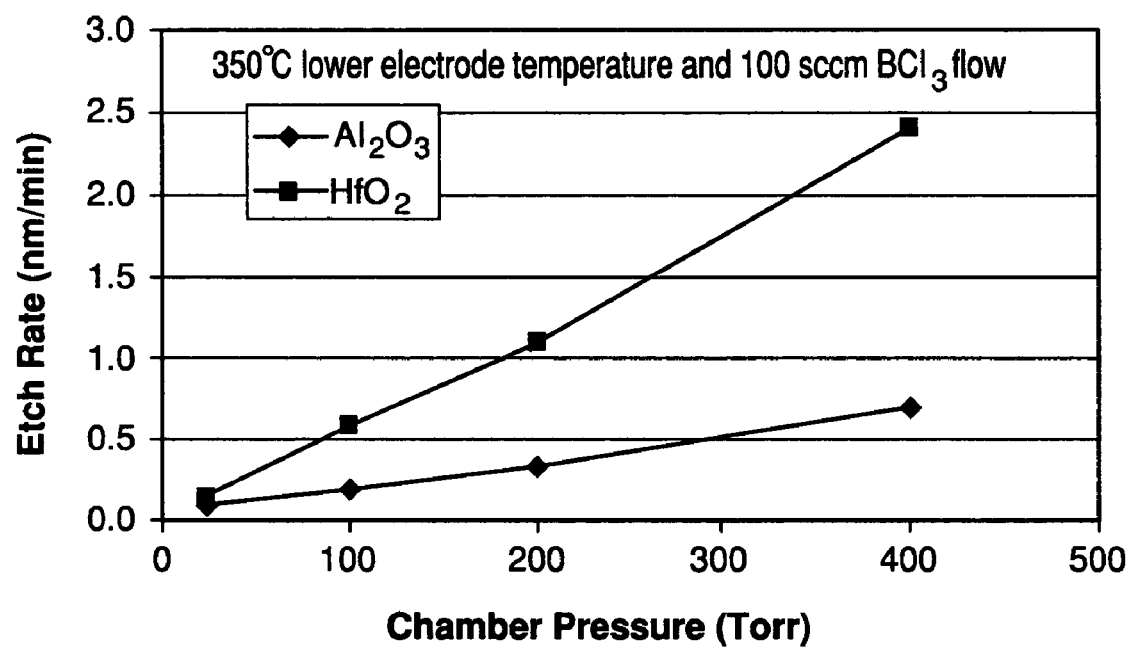
FIG. 6 provides an illustration of the etch rate dependence on chamber pressure at constant lower electrode set temperature and $BCl_3$ flow rate.

FIG. 6 examines the etch rate dependence on chamber pressure at constant lower electrode set temperature and $BCl_3$ flow rate. It can be seen that etch rates increase at higher pressures. At lower electrode temperature about 350° C., increasing chamber pressure is a more effective method to enhance etch rates. Again, the etch rates of $HfO_2$ are higher than those of $Al_2O_3$ under the same conditions.

The data in Tables 29 and 30 shows that there is no strong dependence between etch rate and $BCl_3$ flow rate. This means one can operate thermal etching/cleaning either with continuous flow of etchant gases (such as $BCl_3$) or with static chamber at a set pressure without flow.

Comparative Example 1

$NF_3$ Plasma Etching/Cleaning of $Al_2O_3$, $HfO_2$, and $ZrO_2$ Samples

Figure 2:
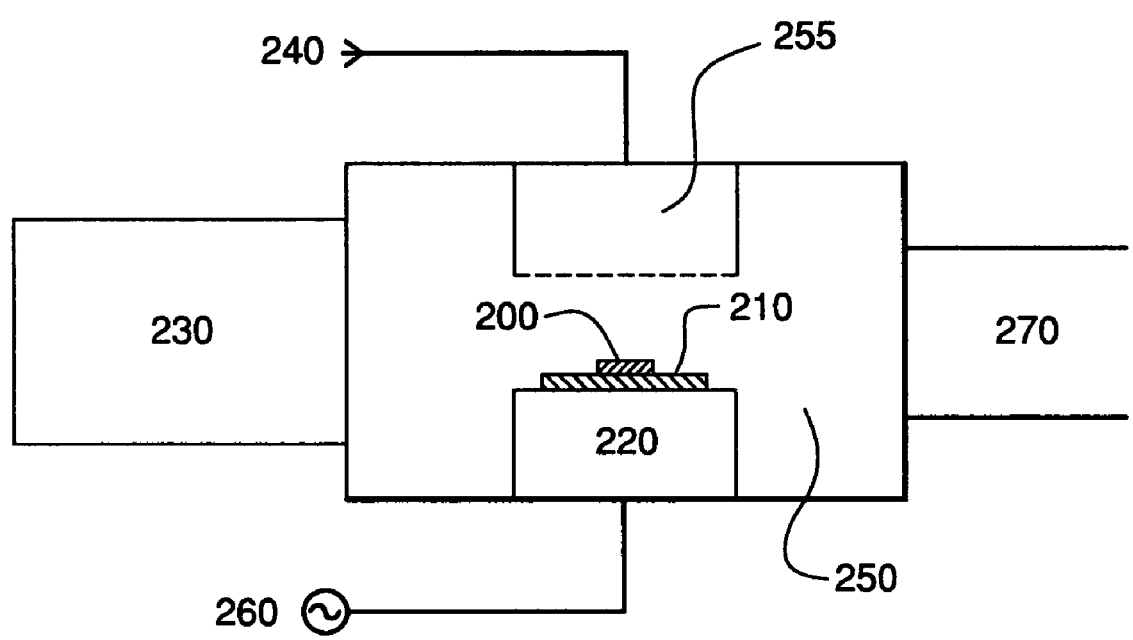
FIG. 2 provides an illustration of an apparatus for performing a process of the invention using plasma as the energy source.

A set of plasma experiments were conducted using a mixture of 8.7 standard cubic centimeter (sccm) $NF_3$ and 49.3 sccm He in the same apparatus as shown in FIG. 2 and following the same method as Examples 1 through 3. Three different high-k materials, $Al_2O_3$, $HfO_2$, and $ZrO_2$, were tested at a variety of power density and chamber pressure. Detailed experimental conditions and results are provided in Table 31. As the results in Table 31 show, higher power density and reduced chamber pressure resulted in a higher etch rate. In certain cases, there was a higher bias voltage, which lead to more energetic ion bombardment to help the etch reactions to overcome activation energy barrier and enhances physical sputtering by energetic ions. A lower chamber pressure may also lead to faster desorption and diffusion of reaction byproducts. Compared to $BCl_3$ plasma experimental results in the preceding examples, the $NF_3$ plasma had significantly lower etch rates for either the $Al_2O_3$, the $HfO_2$, or the $ZrO_2$ samples.

TABLE 31

$NF_3$ plasma etching of $Al_2O_3$, $HfO_2$, and $ZrO_2$

| Samples | Power Density (W/cm$^2$) | Pressure (mTorr) | Etch Rate (nm/min) | $V_{bias}$ (V) |
|---|---|---|---|---|
| $Al_2O_3$ | 1.1 | 100 | 11 | 590 |
| $Al_2O_3$ | 1.1 | 250 | 4 | 541 |
| $Al_2O_3$ | 1.1 | 500 | 2 | 456 |
| $Al_2O_3$ | 1.1 | 1000 | 0.1 | 310 |
| $Al_2O_3$ | 0.55 | 500 | 0.1 | 260 |
| $Al_2O_3$ | 0.27 | 500 | 0 | 130 |
| $HfO_2$ | 1 | 250 | 5 | 550 |
| $HfO_2$ | 1 | 500 | 4 | 456 |
| $HfO_2$ | 1 | 1000 | −0.2 | 310 |
| $HfO_2$ | 0.55 | 500 | 0.3 | 260 |
| $HfO_2$ | 0.27 | 500 | −0.1 | 130 |
| $ZrO_2$ | 1 | 500 | 1 | 456 |
| $ZrO_2$ | 1 | 1000 | −0.2 | 310 |
| $ZrO_2$ | 0.55 | 500 | 0.1 | 260 |
| $ZrO_2$ | 0.27 | 500 | 0 | 130 |

Example 6

Plasma Etching/Cleaning of $HfO_2$, $ZrO_2$, and $HfSi_xO_y$ Samples Using a Mixture of $BCl_3$ and $NF_3$ A mixture of $BCl_3$ and $NF_3$ was used to test the etch rates of three different high-k materials, $HfO_2$, $ZrO_2$, and $HfSi_xO_y$. For $HfO_2$, the flow rate of $BCl_3$ was 10 sccm and the flow rate of $NF_3$ was adjusted to obtain different $NF_3$ to $BCl_3$ volumetric ratios. For $ZrO_2$ and $HfSi_xO_y$, the total flow rate was 20 sccm and the flow rates of $BCl_3$ and $NF_3$ were adjusted accordingly to obtain different $NF_3$ to $BCl_3$ volumetric ratios. For all experimental runs, the power density was 0.55 W/cm$^2$ and the chamber pressure was 500 mTorr. The experiments were run using the same set-up as shown in FIG. 2 and following the same method as Examples 1 through 3 and Comparative Example 1.

FIGS. 7a through 7c illustrate the relationship between the volumetric percentage of $NF_3$ in the $BCl_3$ and $NF_3$ mixture and etch rates for $HfO_2$, $HfSi_xO_y$, $ZrO_2$, respectively. Compared to pure $BCl_3$, the etch rates for $HfO_2$ (shown in FIG. 7a) and for $HfSi_xO_y$ (shown in FIG. 7b) were almost doubled at about 25% by volume $NF_3$ and 15% by volume $NF_3$, respectively.

FIG. 7c shows the etch rates of $ZrO_2$ at different $NF_3$ additions to $BCl_3$. Without $NF_3$, $BCl_3$ cannot remove the $ZrO_2$ material under the given plasma condition: 0.55 W/cm$^2$ power density and 500 mTorr reactor chamber pressure. In fact, the thickness of $ZrO_2$ was increased after 1-minute exposure to the $BCl_3$ plasma. Etching, however, occurs with addition of $NF_3$. Similar to $HfO_2$ and $HfSi_xO_y$, there is a maximum etch rate for $ZrO_2$ at about 20% by volume $NF_3$.

While the invention has been described in detail and with reference to specific examples thereof, it will be apparent to one skilled in the art that various changes and modifications can be made therein without departing from the spirit and scope thereof.

The invention claimed is:

1. A process for removing a substance from at least a portion of the surface of a reaction chamber, said process comprising:
    providing a reactor chamber wherein at least a portion of the surface is at least partially coated with the substance and wherein the substance has a dielectric constant of 4.1 or greater and is at least one member of the group consisting of a transition metal oxide, a transition metal silicate, a Group 13 metal oxide, a Group 13 metal silicate, a nitrogen containing transition metal oxide, a nitrogen containing transition metal silicate, or a laminate comprising at least one layer of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate;
    introducing a reactive agent into the reaction chamber wherein the reactive agent comprises at least one fluoride containing compound and at least one other compound comprising $BCl_3$ wherein the amount of fluorine-containing compound is less than 50% by volume of an amount of the at least one other compound;
    exposing the reactive agent to one or more energy sources sufficient to react the substance with the reactive agent and form a volatile product; and
    removing the volatile product from the reaction chamber.

2. The process of claim 1 wherein the at least one other compound further comprises at least one member selected from the group consisting of a boron-containing compound, a carbon-containing compound, a hydrogen-containing compound, a nitrogen-containing compound, a chelating compound, a chlorosilane compound, a hydrochlorosilane compound, and an organochlorosilane compound.

3. The process of claim 1 wherein the reactive agent is exposed to one or more energy sources and the exposing step is conducted prior to the introducing step.

4. The process of claim 1 wherein the reactive agent is exposed to one or more energy sources and the exposing step is conducted during at least a portion of the introducing step.

5. The process of claim 1 wherein a temperature of the exposing step is at least 150° C.

6. The process of claim 1 wherein a pressure of the exposing step is at least 10 mTorr.

7. The process of claim 1 wherein the reactor is an atomic layer deposition reactor.

8. The process of claim 1 wherein the substance is at least one member selected from the group consisting of $Al_2O_3$, $HfO_2$, $ZrO_2$, $HfSi_xO_y$, $ZrSi_xO_y$, wherein x is greater than 0 and y is 2x+2, $Al_2Si_wO_z$, where w is greater than 0 and z is 2w+3, and any of the aforementioned compounds containing nitrogen.

9. The process of claim 1 wherein the substance is a laminate comprising layers of at least one material selected from the group consisting of a transition metal oxide, a transition metal silicate, a Group 13 metal oxide, a Group 13 metal silicate, a nitrogen containing transition metal oxide, a nitrogen containing transition metal silicate, a nitrogen containing Group 13 metal oxide, or a nitrogen containing Group 13 metal silicate.

10. The process of claim 1 wherein the at least one other compound further comprises a carbon-containing compound having the formula $C_xH_yCl_z$, wherein x is a number ranging from 1 to 6, y is a number ranging from 0 to 13, and z is a number ranging 1 from 14.

11. The process of claim 1 wherein the reactive agent is conveyed to the substance from a gas cylinder, a safe delivery system or a vacuum delivery system.

12. The process of claim 1 wherein the reactive agent is formed in situ by a point-of-use generator.

13. The process of claim 1 wherein the substance is contacted with the reactive agent diluted with an inert gas diluent.

14. A process for cleaning a substance from a reactor surface, said process comprising:
    providing a reactor wherein the reactor surface is at least partially coated with the substance and wherein the substance has a dielectric constant of 4.1 or greater and is at least one member of the group consisting of $Al_2O_3$, $HfO_2$, $ZrO_2$, $HfSi_xO_y$, $ZrSi_xO_y$ wherein x is a number greater than 0 and y is 2x+2, $Al_2Si_wO_z$ wherein w is greater than 0 and z is 2w+3 and any of the aforementioned compounds containing nitrogen;
    reacting the substance with a reactive agent to form a volatile product, wherein the reactive agent comprises at least one fluorine-containing compound comprising $NF_3$ and at least one other compound comprising $BCl_3$ wherein the amount of fluorine-containing compound is less than 50% by volume of an amount of the at least one other compound; and
    removing the volatile product from the reactor to thereby remove the substance from the surface.

* * * * *

UNITED STATES PATENT AND TRADEMARK OFFICE
CERTIFICATE OF CORRECTION

| | | |
|---|---|---|
| PATENT NO. | : 7,357,138 B2 | Page 1 of 1 |
| APPLICATION NO. | : 10/723714 | |
| DATED | : April 15, 2008 | |
| INVENTOR(S) | : Bing Ji et al. | |

It is certified that error appears in the above-identified patent and that said Letters Patent is hereby corrected as shown below:

Column 26, Line 14

In claim 8 delete the word "A1$_2$O$_3$," and insert the word -- Al$_2$O$_3$, --

Column 26, Line 45

In claim 14 delete the word "A1$_2$O$_3$," and insert the word -- Al$_2$O$_3$, --

Column 26, Line 47

In claim 14 delete the word "A1$_2$Si$_w$O$_z$" and insert the word -- Al$_2$Si$_w$O$_z$ --

Signed and Sealed this

Eighth Day of July, 2008

JON W. DUDAS
*Director of the United States Patent and Trademark Office*